United States Patent
Taylor

(10) Patent No.: US 9,276,160 B2
(45) Date of Patent: Mar. 1, 2016

(54) POWER SEMICONDUCTOR DEVICE FORMED FROM A VERTICAL THYRISTOR EPITAXIAL LAYER STRUCTURE

(71) Applicants: Opel Solar, Inc., Storrs Mansfield, CT (US); The University of Connecticut, Farmington, CT (US)

(72) Inventor: Geoff W. Taylor, Mansfield, CT (US)

(73) Assignees: Opel Solar, Inc., Storrs Mansfield, CT (US); The University of Connecticut, Farmington, CT (US)

( * ) Notice: Subject to any disclaimer, the term of this patent is extended or adjusted under 35 U.S.C. 154(b) by 0 days.

(21) Appl. No.: 14/287,388

(22) Filed: May 27, 2014

(65) Prior Publication Data

US 2015/0349187 A1    Dec. 3, 2015

(51) Int. Cl.
*H01L 27/148* (2006.01)
*H01L 31/0352* (2006.01)
*H01L 31/113* (2006.01)
*H01L 31/0224* (2006.01)
(Continued)

(52) U.S. Cl.
CPC .............. *H01L 31/1136* (2013.01); *G02B 6/12* (2013.01); *G02B 6/3596* (2013.01); *G02B 6/4295* (2013.01); *G02B 6/43* (2013.01); *H01L 27/1443* (2013.01); *H01L 31/02327* (2013.01); *H01L 31/022408* (2013.01); *H01L 31/03044* (2013.01); *H01L 31/03046* (2013.01); *H01L 31/035209* (2013.01); *G02B 2006/12145* (2013.01)

(58) Field of Classification Search
CPC .................... H01L 31/1113; H01L 27/0617
USPC .................................... 257/113, 115
See application file for complete search history.

(56) References Cited

U.S. PATENT DOCUMENTS 4,636,830 A    1/1987    Bhagat
6,031,243 A    2/2000    Taylor
(Continued)

FOREIGN PATENT DOCUMENTS

WO    WO 02/071490    9/2002
WO    WO 2013/025964    2/2013

OTHER PUBLICATIONS

U.S. Appl. No. 60/376,238, filed Apr. 26, 2002, Geoff W. Taylor.
(Continued)

*Primary Examiner* — Evan Pert
*Assistant Examiner* — Changhyun Yi
(74) *Attorney, Agent, or Firm* — Gordon & Jacobson, P.C.

(57) ABSTRACT

A semiconductor device suitable for power applications includes a thyristor epitaxial layer structure defining an anode region offset vertically from a cathode region with a plurality of intermediate regions therebetween. An anode electrode is electrically coupled to the anode region. A cathode electrode is electrically coupled to the cathode region. A switchable current path that extends vertically between the anode region and the cathode region has a conducting state and a non-conducting state. An epitaxial resistive region is electrically coupled to and extends laterally from one of the plurality of intermediate regions. An FET is provided having a channel that is electrically coupled to the epitaxial resistive region. The FET can be configured to inject (or remove) electrical carriers into (or from) the one intermediate region via the epitaxial resistive region in order to switch the switchable current path between its non-conducting state and its conducting state.

29 Claims, 11 Drawing Sheets

(51) Int. Cl.
  *H01L 31/0232* (2014.01)
  *H01L 27/144* (2006.01)
  *H01L 31/0304* (2006.01)
  *G02B 6/35* (2006.01)
  *G02B 6/42* (2006.01)
  *G02B 6/43* (2006.01)
  *G02B 6/12* (2006.01)

(56) References Cited

U.S. PATENT DOCUMENTS

| | | | |
|---|---|---|---|
| 6,107,649 A | 8/2000 | Zhao | |
| 6,479,844 B2 | 11/2002 | Taylor | |
| 6,841,795 B2 | 1/2005 | Taylor et al. | |
| 6,849,866 B2 | 2/2005 | Taylor | |
| 6,853,014 B2 | 2/2005 | Taylor et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 6,995,407 B2 | 2/2006 | Taylor et al. | |
| 7,332,752 B2 | 2/2008 | Taylor et al. | |
| 8,080,821 B2 | 12/2011 | Taylor | |
| 2004/0079961 A1* | 4/2004 | Taylor et al. | 257/113 |
| 2007/0257275 A1 | 11/2007 | Taylor | |
| 2009/0026967 A1 | 1/2009 | Mazumder et al. | |
| 2009/0166677 A1* | 7/2009 | Shibata et al. | 257/192 |
| 2012/0098029 A1 | 4/2012 | Mazumder | |

OTHER PUBLICATIONS

U.S. Appl. No. 08/949,504, filed Oct. 14, 1997, Geoff W. Taylor.
U.S. Appl. No. 09/710,217, filed Nov. 10, 2000, Geoff W. Taylor.
U.S. Appl. No. 13/921,311, filed Jun. 19, 2013, Geoff W. Taylor.
U.S. Appl. No. 14/222,841, filed Mar. 24, 2014, Geoff W. Taylor.

\* cited by examiner

| P-type Ohmic Contact 230 |
|---|
| P-type layer(s) 228 |
| Undoped Spacer Layer 226 |
| N-type Modulation Doped QW Structure 224 |
| Spacer Layer(s) 222 |
| P-type Modulation Doped QW Structure 220 |
| Undoped spacer layer 218 |
| N-type layer(s) 216 |
| N-type Ohmic Contact 214 |
| Optional Bottom DBR Mirror 212 |
| Substrate 210 |

FIG. 2

POWER SEMICONDUCTOR DEVICE FORMED FROM A VERTICAL THYRISTOR EPITAXIAL LAYER STRUCTURE

BACKGROUND

1. Field

The present application relates to semiconductor devices typically used in power electronics, such as an IGBT (Insulated Gate Bipolar Transistor) or a power MOSFET (Metal Oxide Semiconductor Field Effect Transistor).

2. Related Art

The IGBT is currently the preferred solid state power amplifier in the power industry. It competes for power switching functions with the power MOSFET. The IGBT combines the high power capability of the bipolar transistor with the voltage control capability of the MOSFET. The IGBT is typically used in high voltage power applications where the peak voltage $V_{CE}$ across the device is greater than 1000 V and the device supports output powers of greater than 10 kW. The IV characteristics of the IGBT typically exhibit high current density controlled by a relatively small voltage. The output resistance is much higher than the common emitter configuration of the bipolar transistor, i.e. Rout is more like the common base configuration and the dc input resistance is infinite due to its insulated gate. Thus, the device displays high transconductance in which the output current is controlled by the input voltage. In general, high voltage, high current and low switching frequencies favor IGBTs while low voltage, low current and high switching frequencies are the domain of the power MOSFET.

A conventional prior art vertical type n-channel IGBT is shown in FIG. 1, which includes an N− base layer 103 formed on a P+ substrate 101. The N− base layer 103 forms an epitaxial drift region. A P+ body region 105 is formed by diffusion into the N− base layer 103. An N+ emitter region 107 is formed by diffusion into the P+ body region 105. A gate electrode 111 is formed on an insulating layer 109 that covers a central portion of the N+ emitter region 107, a central portion of the P+ body region 105 and a central portion of the N− base layer 103 as shown. The insulating layer 109 is patterned to expose an outside portion of the N+ emitter region 107 and an outside portion of the P+ body region 105. An emitter electrode 113 is formed in ohmic-contact with the exposed outside portions of the N+ emitter region 107 and an outside portion of the P+ body region 105 as shown. A backside collector electrode 115 is disposed in ohmic-contact with the P+ substrate 101.

The IGBT functions in an ON (conducting) state where current conducts vertically between the top emitter electrode 113 and the backside collector electrode 115 by the following operations. Specifically, a positive bias voltage is applied between the collector electrode 115 and the emitter electrode 113 and a positive bias voltage is applied to the gate electrode 111 relative to the emitter electrode 109 such that inversion layer of electrons forms under the gate electrode 111 at or near the interface between the central portion of the P+ body region 105 and the insulating layer 109. In this manner, electrons are injected from the N+ emitter region 107 into the N− drift region 103. In accordance with the injection amount of the electrons, holes are injected from the collector 115 through the P+ substrate 101 to the N− drift region 103. As a result, the N− drift region 103 is filled with carriers, which decreases the effective resistance of the N− drift region 103 brings the IGBT into the ON (conducting) state.

On the other hand, the IGBT functions in an OFF (non-conducting) state where there is little or no current that conducts vertically between the top emitter electrode 113 and the backside collector electrode 115 by the following operations. Specifically, a reverse bias voltage is applied to the gate electrode 111 relative to the emitter electrode 109 such that there is no inversion layer of electrons formed under the gate electrode 111 at or near the interface between the central portion of the P+ body region 105 and the insulating layer 109. As a result, electrons are not injected from the N+ emitter region 107 into the N− drift region 103, and holes are not injected from the collector 115 through the P+ substrate 101 to the N− drift region 103. As a result, the N− drift region 103 is depleted of carriers, which increases the effective resistance of the N− drift region 103 brings the IGBT into the OFF (non-conducting) state.

When configuring the device from the ON state to the OFF state, holes accumulated in the N− drift region 103 are exhausted through the P+ body region 105 and to the emitter electrode 113. This flow of accumulated holes can limit the switching frequency of the IGBT and thus adversely impact the suitability of the IGBT for applications where high switching frequencies are required. For example, typical IGBTs operate at switching frequencies less than 100 kHz.

Gate drive circuitry that control the ON-OFF operation of one or more IGBTs are also commonplace. Such gate drive circuitry can include one or more opto-isolators that employ a light emitting diode and corresponding photodiode that interface to one another via optical signals emitted by the light emitting diode and received by the corresponding photodiode. The opto-isolator provides for electrical isolation between an electrical input signal and the electrical gate drive signal that controls the ON-OFF operation of the IGBT.

US2012/0098029 describes a thyristor core with an optically-activated gate that is controlled by monolithically or hybrid integrated switches S1 and S2 and a laser for device turn-on and off.

SUMMARY

A semiconductor device suitable for power applications includes a thyristor epitaxial layer structure formed on a substrate. The thyristor epitaxial structure defines an anode region offset vertically from a cathode region with a plurality of intermediate regions therebetween together with a switchable current path extending vertically between the anode region and the cathode region through the plurality of intermediate regions. The switchable current path has a conducting state where current flows through the current path between the anode region and the cathode region, and has a non-conducting state where current does not flow through the current path between the anode region and the cathode region. An anode terminal electrode is electrically coupled to the anode region. A cathode terminal electrode is electrically coupled to the cathode region. An epitaxial resistive region is electrically coupled to and extends laterally from a particular one of the plurality of intermediate regions. A first field effect transistor having a channel for current flow therethrough is integrally formed on the substrate together with the thyristor epitaxial layer structure, the anode terminal electrode, the cathode terminal electrode, and the epitaxial resistive region.

In one embodiment, the channel of the first field effect transistor, the epitaxial resistive region and the particular one intermediate region of the thyristor epitaxial layer structure can all be formed from a common modulation doped QW structure.

In another embodiment, the intermediate regions of the thyristor epitaxial layer structure can include at least one of an n-type modulation doped QW structure and a p-type modulation doped QW structure.

In yet another embodiment, the intermediate regions of the thyristor epitaxial layer structure can include both an n-type modulation doped QW structure and a p-type modulation doped QW structure.

The epitaxial resistive region can be configured to provide protection against voltage breakdown between the anode terminal electrode and the first field effect transistor for anode voltages at least greater than a decavolt.

The first field effect transistor can be configured to inject electrical carriers into the particular one intermediate region in order to switch the switchable current path from its non-conducting state into its conducting state. Alternatively, the first field effect transistor can be configured to remove electrical carriers from the particular one intermediate region in order to switch the switchable current path from its conducting state into its non-conducting state.

The semiconductor device can also include a second field effect transistor integrally formed on the substrate. The second field effect transistor has a channel for current flow therethrough, wherein the channel of the second field effect transistor is electrically coupled to another one of the plurality of intermediate regions. The second field effect transistor can be configured to remove electrical carriers from the another one intermediate region in order to switch the switchable current path from its conducting state into its non-conducting state.

The plurality of intermediate regions can include a spacer region configured to provide a forward breakdown voltage at least greater than a decavolt.

In one embodiment, the semiconductor device can also include a first shunt electrode part that provides electrical coupling between the cathode terminal electrode and the first field effect transistor. The first field effect transistor can be an n-type field effect transistor with source and drain terminal electrodes disposed on opposite sides of a gate terminal electrode and an n-type channel disposed under the gate terminal electrode. The first shunt electrode part can be formed by metal on a sidewall that extends between the bottom cathode terminal electrode and the source terminal electrode of the first field effect transistor.

In another embodiment, the second field effect transistor can be a p-type field effect transistor with source and drain terminal electrodes disposed on opposite sides of a gate terminal electrode and a p-type channel disposed under the gate terminal electrode. A second shunt electrode part can be formed to provide electrical coupling between the cathode terminal electrode and the second field effect transistor. The second shunt electrode part can be formed by metal on a sidewall that extends between the bottom cathode terminal electrode and the drain terminal electrode of the second field effect transistor.

The thyristor epitaxial layer structure can be configured to switch the switchable current path between its conducting state and its non-conducting state based on presence and absence of an optical signal within the thyristor epitaxial layer structure. In one embodiment, the thyristor epitaxial layer structure can be part of a waveguide that guides in-plane propagation of the optical signal. In another embodiment, the thyristor epitaxial layer structure can be part of a resonant cavity offset from a waveguide by a gap region therebetween. The waveguide can be configured to guide in-plane propagation of the optical signal. The resonant cavity can be configured to receive the optical signal by evanescent coupling between the waveguide and the resonant cavity. The resonant cavity can have an annular shape defined by an annular mesa formed by the thyristor epitaxial layer structure. The waveguide can be an epitaxial waveguide formed from a common epitaxial layer structure that forms the thyristor epitaxial layer structure. The first field effect transistor can be configured to drain electrical carriers from the particular one intermediate region when the optical signal is not present in order to switch the switchable current path from its conducting state into its non-conducting state. A second field effect transistor can be configured to remove electrical carriers from another one of the plurality of intermediate regions when the optical signal is not present in order to switch the switchable current path from its conducting state into its non-conducting state.

At least the thyristor epitaxial layer structure can be formed from group III-V materials. Such group III-V materials can be selected from the group consisting of gallium and nitrogen (for gallium nitride layer structures), gallium and arsenic (for gallium arsenside layers structures) as well as aluminum, indium, and combinations thereof.

In another aspect, an integrated circuit can include a substrate and array of semiconductor devices as described herein. The integrated circuit can include control circuitry that controls switching operations of the array of semiconductor devices, where the control circuitry is integrally formed on the substrate. The control circuitry can include at least one optical emitter and corresponding waveguide that guides in-plane propagation of an optical signal to the array of semiconductor devices.

BRIEF DESCRIPTION OF THE DRAWINGS

FIG. 2 is a schematic cross-section view of an epitaxial layer structure that can be used to form the semiconductor devices and integrated circuits as described herein

DETAILED DESCRIPTION OF THE PREFERRED EMBODIMENTS

Figure 1:
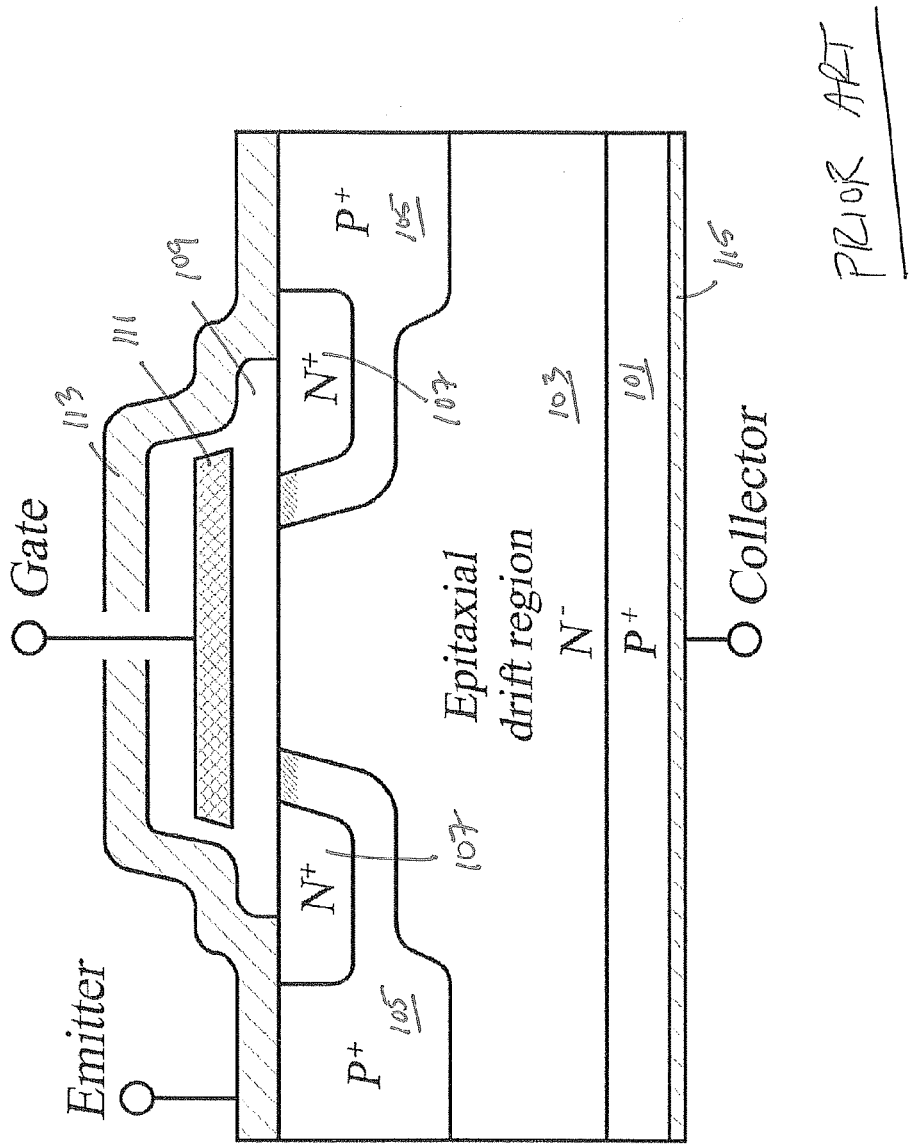
FIG. 1 is a schematic cross-section view of a prior art IGBT (Insulated Gate Bipolar Transistor).

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,413, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; International Patent Application No. PCT/US12/51265, filed on Aug. 17, 2012; U.S. patent application Ser. No. 13/921,311, filed on Jun. 19, 2013; and U.S. patent application Ser. No. 14/222,841, filed on Mar. 24, 2014; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures can be realized with group III-V materials. Such group III-V materials can include gallium (Ga) and arsenic (As) (for gallium arsenide layer structures) as well as aluminum (Al) and indium (In), and thus can include GaAs, AlGaAs, and InGaAs semiconductor alloys. Alternatively, such group III-V materials can include gallium (Ga) and nitrogen (N) (for gallium nitride layer structures) as well as aluminum (Al) and indium (In), and thus can include GaN, AlGaN, and InGaN semiconductor alloys.

POET can be used to construct a variety of optoelectronic devices. POET can also be used to construct a variety of high performance transistor devices, such as complementary n-channel and p-channel HFET unipolar transistor devices as well as n-type and p-type HBT bipolar transistor devices.

Turning now to FIG. 2, the device structure of the present application includes an optional bottom dielectric distributed Bragg reflector (DBR) mirror 212 formed on substrate 210. The bottom DBR mirror 212 can be formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_C$. Deposited upon the bottom DBR mirror 212 (or upon the substrate 210 for the case where the bottom DBR mirror 212 is omitted) is the active device structure suitable for realizing complementary heterostructure field-effect transistor (HFET) devices. The first of these complementary HFET devices is a p-channel HFET formed from a p-type modulation doped quantum well (QW) structure 220 with an n-type gate region (i.e., n-type ohmic contact layer 214 and n-type layer(s) 216)) below the p-type modulation doped QW structure 220. An undoped spacer layer 218 is disposed between the p-type modulation doped quantum well (QW) structure 220 and the underlying n-type layer(s) 216. One or more spacer layers 222 are disposed above the p-type modulation doped QW structure 220. The second of these complementary HFET devices is an n-channel HFET formed by an n-type modulation doped QW structure 224 with a p-type gate region (i.e., p-type layer(s) 228 and p-type ohmic contact 230) disposed above the n-type modulation doped QW structure 224. An undoped spacer layer 226 is disposed between the n-type modulation doped QW structure 224 and the overlying p-type layer(s) 228. The layers encompassing the spacer layer 222 and the n-type modulation doped QW structure 224 forms the collector region of the p-channel HFET. Similarly, the layers encompassing the spacer layer 222 and the p-type modulation doped QW structure 220 forms the collector region of the n-channel HFET. Such collector regions are analogous to the substrate region of a MOSFET device as is well known. Therefore, a non-inverted n-channel HFET device can be stacked upon an inverted p-channel HFET device as part of the active device structure.

The active device layer structure begins with n-type ohmic contact layer(s) 214 which enables the formation of ohmic contacts thereto. Deposited on layer 214 are one or more n-type layers 216 and an undoped spacer layer 218 which serve electrically as part of the gate of the p-channel HFET device and optically as a part of the lower waveguide cladding of the active device structure. Deposited on layer 218 is the p-type modulation doped QW structure 220 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 220. All of the layers grown thus far form the p-channel HFET device with the gate ohmic contact on the bottom. Deposited on the p-type modulation doped QW structure 220 is one or more spacer layers 222.

Deposited on the spacer layer(s) 222 is the n-type modulation doped QW structure 224. The n-type modulation doped QW structure 224 defines an n-type charge sheet offset from one or more QWs by an undoped spacer layer. The n-type charge sheet is formed last above the undoped spacer and the one or more QWs of the n-type modulation doped QW structure 224.

Deposited on the n-type modulation doped QW structure 224 is an undoped spacer layer 226 and one or more p-type layers 228 which can serve electrically as part of the gate of the n-channel HFET and optically as part of the upper waveguide cladding of the device. The p-type layers 228 can include two sheets of planar doping of highly doped p-material separated by a lightly doped layer of p-material. These p-type layers are offset from the n-type modulation doped quantum well structure 224 by the undoped spacer layer 226. In this configuration, the top charge sheet achieves low gate contact resistance and the bottom charge sheet defines the capacitance of the n-channel HFET with respect to the n-type modulation doped QW structure 224. Deposited on p-type layer(s) 228 is one or more p-type ohmic contact layer(s) 230, which enables the formation of ohmic contacts thereto.

For the n-channel HFET device, a gate terminal electrode of the n-channel HFET device interfaces to the top p-type ohmic contact layer(s) 230. A source terminal electrode and a drain terminal electrode of the n-channel HFET device are operably coupled to opposite ends of an elongate QW channel realized in the n-type modulation doped QW structure 224. One or more collector terminal electrodes can be operably coupled to the p-type modulation doped QW structure 220.

For the p-channel HFET device, a gate terminal electrode of the p-channel HFET device interfaces to the bottom n-type ohmic contact layer 214. A source terminal electrode and a drain terminal electrode are operably coupled to opposite ends of an elongate QW channel realized in the p-type modulation doped QW structure 220. The layer structure of the p-channel HFET device can be patterned and etched down to form a mesa at spacer layer 222 with a collector electrode formed on such mesa.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped quantum well structure 224 between the source terminal electrode and the drain terminal electrode. In this configuration, the source terminal electrode is the terminal electrode from which the electron carriers enter the QW channel of the n-type modulation doped quantum well structure 224, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation doped quantum well structure 220 between the source terminal electrode and the drain terminal electrode. In this configuration, the source terminal electrode is the terminal from which the hole carriers enter the QW channel of the p-type modulation doped quantum well structure 220, the drain terminal electrode is the terminal where the hole carriers leave the device, and the gate terminal electrode is the control terminal for the device.

The device structure of the present application can also be configured to realize bipolar inversion channel field-effect transistors (BICFETs) with either an n-type modulation doped quantum well inversion channel base region (n-channel base BICFET) or a p-type modulation doped quantum well inversion channel base region (p-channel base BICFET).

For the n-channel base BICFET device, an emitter terminal electrode of the re-channel base BICFET device interfaces to the top p-type ohmic contact layer(s) 30 of the active device structure. A base terminal electrode of the n-channel base BICFET device is operably coupled to the QW channel realized in the n-type modulation doped QW structure 224. A collector terminal electrode of the n-channel base BICFET device is operably coupled to the p-type modulation doped QW structure 220. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

The p-channel base BICFET device is similar in construction to the p-channel HFET device with the following adaptations. An emitter terminal electrode of the p-channel base BICFET device, which is analogous to the gate terminal electrode of the p-channel HFET device, interfaces to the bottom n-type ohmic contact layer(s) 214 of the active device structure. A base terminal electrode of the p-channel base BICFET device, which is analogous to the source or drain electrode of the p-channel HFET device, is operably coupled to the QW channel realized in the p-type modulation doped QW structure 220. A collector terminal electrode of the p-channel base BICFET device, which is analogous to the collector terminal electrode of the p-channel HFET device, is operably coupled to the spacer layer 222. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The active device structure of the present application can also be configured to realize a variety of electrical and optoelectronic thyristor devices having vertical P-N-P-N thyristor structure. The upper p-type region (i.e., the first P) of the vertical P-N-P-N thyristor structure is formed by the p-type layers 228, 230 of the active device structure. The upper n-type region (i.e., the first N) of the vertical P-N-P-N thyristor structure is formed from the n-type modulation doped QW structure 224 of the active device structure. The lower p-type region (i.e., the second P) of the vertical P-N-P-N thyristor structure is formed from the p-type modulation doped QW structure 220 of the active device structure. The lower n-type region (i.e., the second N) of the vertical P-N-P-N thyristor structure is formed by the bottom n-type layers 216, 214 of the active device structure.

In accordance with the present application, the layer structure of FIG. 2 can be utilized to realize an integrated circuit that includes one or more power thyristor devices. The power thyristor device includes a vertical P-N-P-N thyristor structure defined by the layer structure of FIG. 2 with a top anode terminal electrode in electrical contact to the top p-type anode region of the vertical P-N-P-N thyristor structure and a bottom cathode terminal electrode in electrical contact to the bottom n-type cathode region of the vertical P-N-P-N thyristor structure. The power thyristor device can also include an n-channel HFET device that is integrally formed with the vertical P-N-P-N thyristor structure and offset laterally from the vertical P-N-P-N thyristor structure. The n-channel HFET device can be operated to control injection (or removal) of majority carrier electrons into (or from) the upper n-type region of the vertical P-N-P-N thyristor structure via an epitaxial resistive region formed between the n-channel HFET device and the upper n-type region of the vertical P-N-P-N thyristor structure in order to control switching of the current path of the vertical P-N-P-N thyristor structure between the anode terminal electrode and the cathode terminal electrode between an ON state (forward conducting) and an OFF state (current blocking state) where there is minimal current flow between the anode terminal electrode 302 and the cathode terminal electrode (parts 303A, 303B) to an ON state (or forward conducting state) where relative large current flow between the anode terminal electrode 302 and the cathode terminal electrode (parts 303A, 303B). The epitaxial resistive region can provide for protection to avoid gate-drain breakdown of the n-channel HFET device when switching the current path of the vertical P-N-P-N thyristor structure into its ON state under high voltage conditions for many diverse power applications as described herein. The epitaxial resistive region can also provide protection to avoid drain-source breakdown of the n-channel HFET device when switching the current path of the vertical P-N-P-N thyristor structure into its ON state under high voltage conditions for many diverse power applications as described herein. The power thyristor device can also include a p-channel HFET device that is integrally formed with the vertical P-N-P-N thyristor structure and offset laterally from the vertical P-N-P-N thyristor structure. The p-channel HFET device can be operated to control the injection (or removal) of majority carrier holes into (or from) the lower p-type region of the vertical P-N-P-N thyristor structure in order to control switching of the current path of the vertical P-N-P-N thyristor structure. Electrically-activated arrays and optically-activated arrays of such power thyristor devices along with waveguides and optical emitters for control can also be part of the integrated circuit.

Figure 3A:
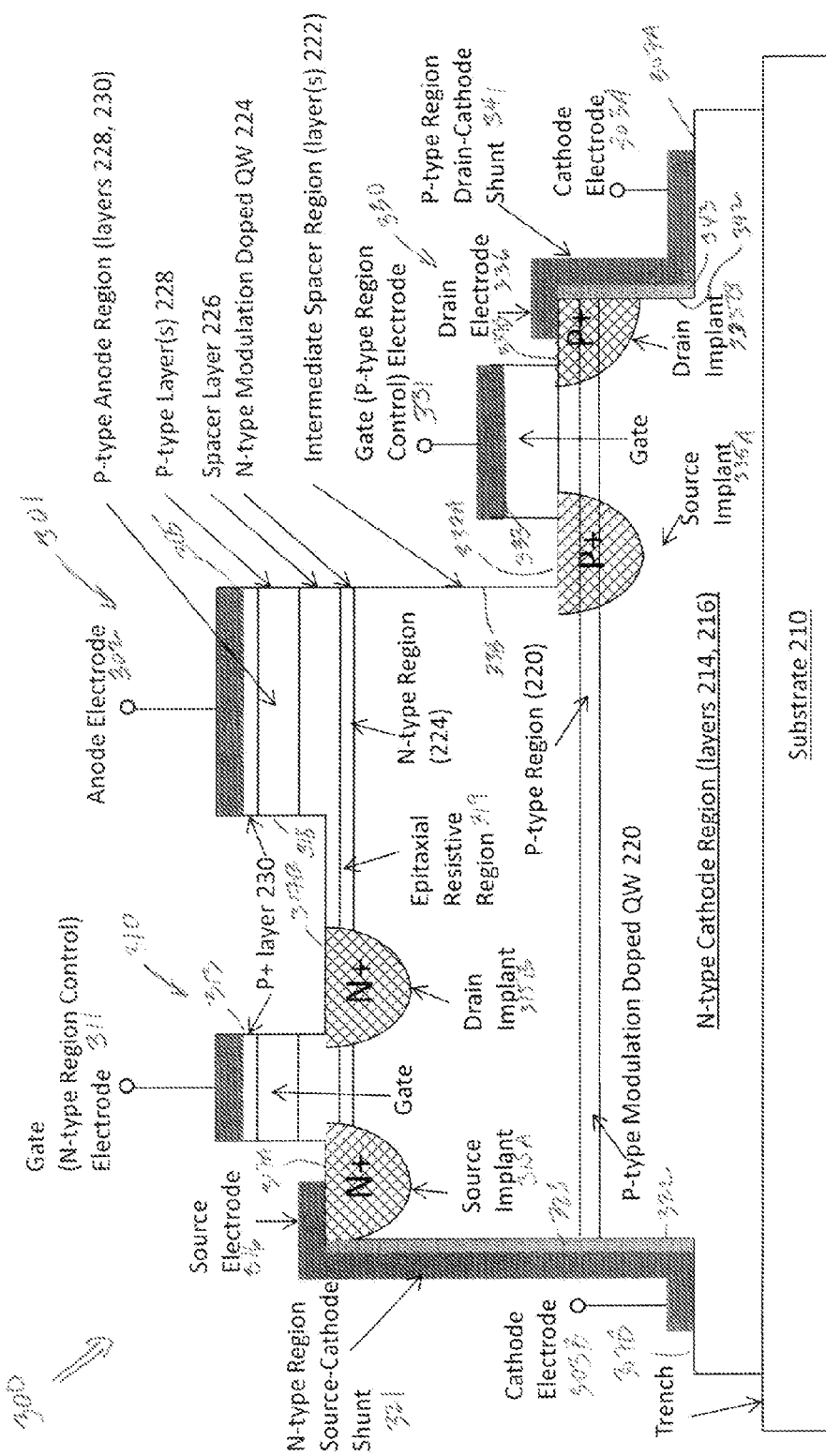
FIG. 3A is a schematic cross-section view of an embodiment of an electrically-controlled power thyristor device formed from the epitaxial layer structure of FIG. 2.
Figure 3B:
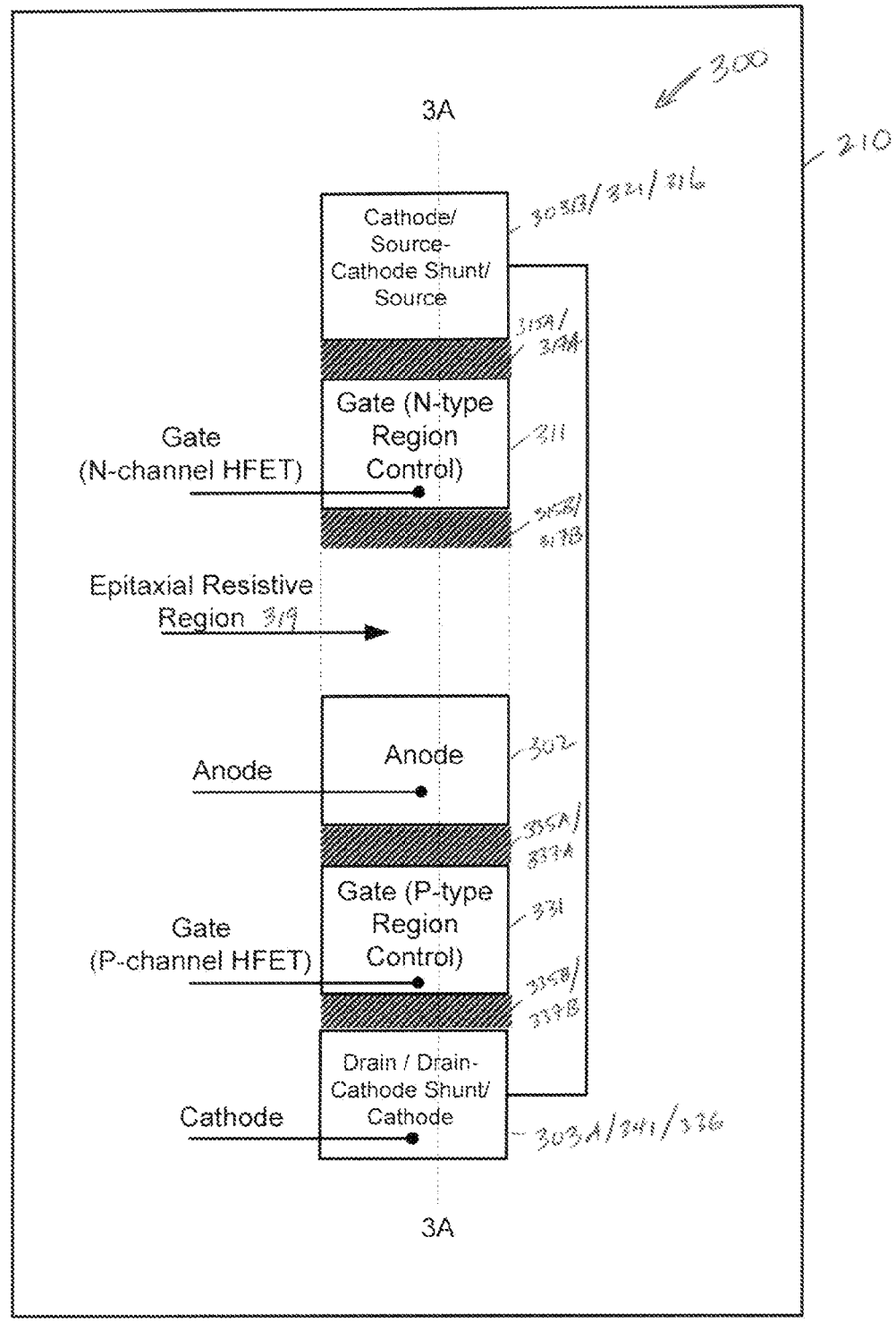
FIG. 3B is a schematic top view of the power thyristor device of FIG. 3A.

FIGS. 3A and 3B are cross-sectional and top schematic views, respectively, of a first embodiment of a power thyristor device 300 realized as part of an integrated circuit that employs the layer structure of FIG. 2. The power thyristor device 300 includes a vertical P-N-P-N thyristor structure 301 defined by the layer structure of FIG. 2 with a top anode terminal electrode 302 and a bottom cathode terminal electrode with two parts 303A and 303B as shown. The top anode terminal electrode 302 is formed on a mesa 305 (which can have a rectangular shape or outline) defined by the top surface of the p+-type ohmic contact layer 230. The anode terminal electrode 302 is formed in electrical contact with a p-type anode region (i.e., the first P) of the vertical P-N-P-N thyristor structure 301. The p-type anode region is defined by the p-type layers 230 and 228 that underlie the anode terminal electrode 301 as part of the mesa 305. The metal of the anode terminal electrode 302 can be tungsten or other suitable metal or alloy that is patterned by lift off or another suitable metallization process. The p-type anode region of layers 230 and 228 is spaced vertically above an upper n-type region (i.e., the first N) of the vertical P-N-P-N thyristor structure 301, which is defined by the n-type modulation doped QW structure 224. A spacer layer 226 is disposed between the p-type anode region and the upper n-type region defined by the n-type modulation doped QW structure 224. The upper n-type region is spaced vertically above a lower p-type region (i.e., the second P) of the vertical P-N-P-N thyristor structure 301, which is defined by the p-type modulation doped QW structure 220. An intermediate spacer region (which is defined by the spacer layer(s) 222) is disposed between the upper n-type region and the lower p-type region. The lower p-type region is spaced vertically above a bottom n-type cathode region (i.e., the second N) of the vertical P-N-P-N thyristor structure 301, which is defined by the n-type layers 216 and 214. One or more spacer layers 218 are disposed between the lower p-type region and the bottom n-type cathode region. The cathode terminal electrode 303 includes two parts 303A and 303B that are formed on separate mesas 307A, 307B defined at the n-type ohmic contact layer 214 for electrical contact to the bottom n-type cathode region of the vertical P-N-P-N thyristor structure 301.

The power thyristor device 300 also includes an n-channel HFET device 310 that is integrally formed with the vertical P-N-P-N thyristor structure 301 and offset laterally from the vertical P-N-P-N thyristor structure 301. The n-channel HFET device 310 is defined in the layer structure of FIG. 2 with a gate terminal electrode 311 formed on a mesa 313 (which can have a rectangular shape) defined by the top surface of the p+-type ohmic contact layer 230. The gate terminal electrode 311 is formed in electrical contact with a p-type gate region disposed therebelow. The mesa 313 of the gate terminal electrode 311 of the n-channel HFET device 310 is offset laterally from the mesa 305 of the anode terminal electrode 302 of the vertical P-N-P-N thyristor structure 301 as shown. The metal of the gate terminal electrode 311 can be the same metal as the anode terminal electrode 302 (such as tungsten or other suitable metal or alloy) and patterned together by lift off or another suitable metallization process. Source and drain ion implant regions 315A, 315B of N+ ion species are implanted through intermediate mesas 317A, 317B formed at spacer layer 226 on opposite sides of the gate mesa 313. The intermediate mesas 317A, 317 can have a rectangular shape. A source terminal electrode 316 is formed on the mesa 317A in electrical contact with the source N+ ion implant region 315A. The mesa 317B corresponding to the drain implant region 315B can extend laterally to a sidewall 318 that forms the mesa 305 of the vertical P-N-P-N thyristor structure 301 as shown. The source and drain ion implant regions 315A, 315B both extend to a depth that encompass the n-type modulation doped QW structure 224. A current path between the source terminal electrode 316/source implant region 315A and the drain implant region 315B of the n-channel HFET device 310 is defined by the n-type modulation doped QW structure 224 that underlies the gate electrode 311 of the re-channel HFET device 310. This current path extends beyond the drain implant region 315B through an epitaxial resistive region 319 (which is also defined by the n-type modulation doped QW structure 224) to the upper n-type region (which is defined by the n-type modulation doped QW structure 224) of the vertical P-N-P-N thyristor structure 301. In this manner, the epitaxial resistive region 319 is electrically connected in series between the source-drain current path of the n-channel HFET device 310 and the upper n-type region of the vertical P-N-P-N thyristor structure 301. The length dimension of the epitaxial resistive region 319 (which is governed by the spacing between the drain implant region 315B of the n-channel HFET device 310 and the upper n-type region of the vertical P-N-P-N thyristor structure 301) can be used to control the resistance provided by the epitaxial resistive region 319. For example, the length dimension of the epitaxial resistive region 319 can be increased in magnitude to afford greater resistance, while the length dimension of the epitaxial resistive region 319 can be decreased in magnitude to afford lesser resistance. Such length dimension is not necessarily shown to scale in FIG. 3.

The n-channel HFET device 310 is operated to control injection of majority carrier electrons into the upper n-type region of the vertical P-N-P-N thyristor structure 301 via the resistive region 319 to cause the current path of the vertical P-N-P-N thyristor structure 301 between the anode terminal electrode 302 and the cathode terminal electrode (parts 303A, 303B) to switch from an OFF state (or current blocking state) where there is minimal current flow between the anode terminal electrode 302 and the cathode terminal electrode (parts 303A, 303B) to an ON state (or forward conducting state) where relative large current flow between the anode terminal electrode 302 and the cathode terminal electrode (parts 303A, 303B). Specifically, the current path through the vertical P-N-P-N thyristor structure 301 switches from the OFF state to the ON state when i) the anode terminal electrode 302 is forward biased with respect to the cathode terminal electrode parts 303A, 303B and ii) the n-channel HFET device 310 is operated as a current source to inject electrons into the upper n-type region of the vertical P-N-P-N thyristor structure 301 via the resistive region 319 such that charge is produced in the n-type modulation doped QW structure 224 of the vertical P-N-P-N thyristor structure 301 that is greater than the critical switching charge QCR, which is that charge that reduces the forward breakdown voltage of the vertical P-N-P-N thyristor structure 301 such that no off state bias point exists. The n-channel HFET device 310 is operated as an electron current source to inject electrons into the upper n-type region of the vertical P-N-P-N thyristor structure 301 via the resistive region 319 by applying a voltage potential to the gate terminal electrode 311 (relative to the source terminal electrode 316) such that an inversion layer of electron gas is created in the QW channel of the n-type modulation doped quantum well structure 224 between the source ion implant 315A and the drain ion implant 315B. This electron inversion layer allows for electron current to flow from the source terminal electrode 316 and through the QW channel of the n-type modulation doped quantum well structure 224 between the source ion implant 315A and the drain ion implant 315B and beyond the drain ion implant 315B through the resistive region 319 to the upper n-type region of the vertical P-N-P-N thyristor structure 301. The voltage potential signal applied to the gate terminal electrode 311 is continued for a period of time sufficient to produce charge in the n-type modulation doped QW structure 224 of the vertical P-N-P-N thyristor structure 301 that is greater than the critical switching charge QCR. After this time period, the gate voltage potential signal can be reduced. However, the vertical P-N-P-N thyristor structure 301 can remain in the ON state irrespective of the gate voltage potential signal due to the latch-up operation of the vertical P-N-P-N thyristor structure 301.

In one embodiment, the electrons that are injected by the n-channel HFET device 310 into the upper n-type region of the vertical P-N-P-N thyristor structure 301 are sourced from the cathode terminal electrode part 303B of the thyristor structure 301 by a conductive shunt 321 that extends between the cathode terminal electrode part 303B and the source terminal electrode 316. In this configuration, the cathode terminal part 303B is operated at a low voltage potential (such as ground potential) that functions as source of electrons for injection into the upper n-type region of the vertical P-N-P-N thyristor structure 301 via the resistive region 319. The cathode terminal electrode parts 303A, 303B, the shunt 321 and the source terminal electrode can be realized from a common metal that is deposited and patterned together to form the metal parts as shown. The shunt 321 can extend along a sidewall 322 leading from the mesa 307B of the cathode terminal electrode part 303B to the mesa 317A of the source electrode 316. An electrically-insulating material 323 (such as an oxide) can be formed on the sidewall 322 between the shunt 321 and the sidewall 322 in order to prevent current leakage into the epitaxial layers disposed below the n-channel HFET device 310.

The power thyristor device 300 also includes a p-channel HFET device 330 that is integrally formed with the vertical P-N-P-N thyristor structure 301 and offset laterally from the vertical P-N-P-N thyristor structure 301 opposite the n-channel HFET device 310. The p-channel HFET device 330 is defined in the layer structure of FIG. 2 with a gate terminal electrode 331 formed on a mesa 333 (which can have a rectangular shape) defined in the spacer layer(s) 222. The gate terminal electrode 331 is formed in electrical contact with a gate region disposed therebelow. The mesa 333 of the gate terminal electrode 331 of the p-channel HFET device 330 is offset laterally from the mesa 305 of the anode terminal electrode 302 of the vertical P-N-P-N thyristor structure 301 as shown. The metal of the gate terminal electrode 331 can be the same metal as the source terminal electrode 316 and the cathode terminal electrode parts 303A, 303B and patterned together by lift off or another suitable metallization process. Source and drain ion implant regions 335A, 335B of P+ ion species are implanted through intermediate mesas 337A, 337B formed at spacer layer 222 on opposite sides of the gate mesa 333. The intermediate mesas 337A, 337B can have a rectangular shape. A drain terminal electrode 336 is formed on the mesa 337B in electrical contact with the drain P+ ion implant region 335B. The mesa 337A corresponding to the source implant region 335A can extend laterally to a sidewall 338 that forms the mesa 305 of the vertical P-N-P-N thyristor structure 301 as shown. The source and drain ion implant regions 335A, 335B both extend to a depth that encompass the p-type modulation doped QW structure 220. A current path between the source implant region 335A and the drain terminal electrode 336/drain implant region 335B is defined by the p-type modulation doped QW structure 220 that underlies the gate electrode 331 of the p-channel HFET device 330. This current path extends beyond the source implant region 335B to the lower p-type region (which is defined by the p-type modulation doped QW structure 220) of the vertical P-N-P-N thyristor structure 301.

The p-channel HFET device 330 is operated to control removal of majority carrier holes from the lower p-type region of the vertical P-N-P-N thyristor structure 301 to cause the current path of the vertical P-N-P-N thyristor structure 301 between the anode terminal electrode 302 and the cathode terminal electrode (parts 303A, 303B) to switch from the ON state to the OFF state. Specifically, the current path through the vertical P-N-P-N thyristor structure 301 switches from the ON state to the OFF state when i) the anode terminal electrode 302 is forward biased with respect to the cathode terminal electrode parts 303A, 303B and ii) the p-channel HFET device 330 is operated to remove holes from the lower p-type region of the vertical P-N-P-N thyristor structure 301 such that the charge in the p-type modulation doped QW structure 220 of the vertical P-N-P-N thyristor structure 301 decreases below the holding charge $Q_H$, which is the critical value of the channel charge which will sustain holding action. The p-channel HFET device 330 is operated as a hole current sink to remove holes from the lower p-type region of the vertical P-N-P-N thyristor structure 301 by applying a voltage potential to the gate terminal electrode 331 (relative to the drain terminal electrode 336) such that an inversion layer of hole gas is created in the QW channel of the p-type modulation doped quantum well structure 220 between the source ion implant 335A and the drain ion implant 335B of the PHFET device 330. This hole inversion layer allows for hole current to flow from the lower p-type region of the vertical P-N-P-N thyristor structure 301 through the QW channel of the p-type modulation doped quantum well structure 220 between the source ion implant 335A and the drain ion implant 335B to the drain electrode 336. The voltage potential signal applied to the gate terminal electrode 331 is continued for a period of time sufficient to decrease charge in the p-type modulation doped QW structure 220 of the vertical P-N-P-N thyristor structure 301 below the holding charge $Q_H$. After this time period, the gate voltage potential signal can be reduced. However, the vertical P-N-P-N thyristor structure 301 can remain in the OFF state irrespective of the gate voltage potential signal due to the latch-up operation of the vertical P-N-P-N thyristor structure 301.

In one embodiment, the holes that are removed by the p-channel HFET device 330 from the lower p-type region of the vertical P-N-P-N thyristor structure 301 flow from the drain terminal electrode 336 to the cathode terminal electrode part 303A of the vertical P-N-P-N thyristor structure 301 by a conductive shunt 341 that extends between the drain terminal electrode 336 and the cathode terminal electrode part 303A. In this configuration, the cathode terminal part 303A is operated at a low voltage potential (such as ground potential) that functions as sink of holes removed from the lower p-type region of the vertical P-N-P-N thyristor structure 301. The cathode terminal electrode parts 303A, 303B, the source terminal electrode 316, the shunts 321, 341 and the drain terminal electrode 336 can be realized from a common metal that is deposited and patterned together to form the metal parts as shown. The shunt 341 can extend along a sidewall 342 leading from the mesa 307A of the cathode terminal electrode part 303A to the mesa 337B of the drain electrode 336. An electrically-insulating material 343 (such as an oxide) can be formed on the sidewall 342 between the shunt 341 and the sidewall 342 in order to prevent current leakage into the epitaxial layers disposed below the p-channel HFET device 330.

Figure 4:
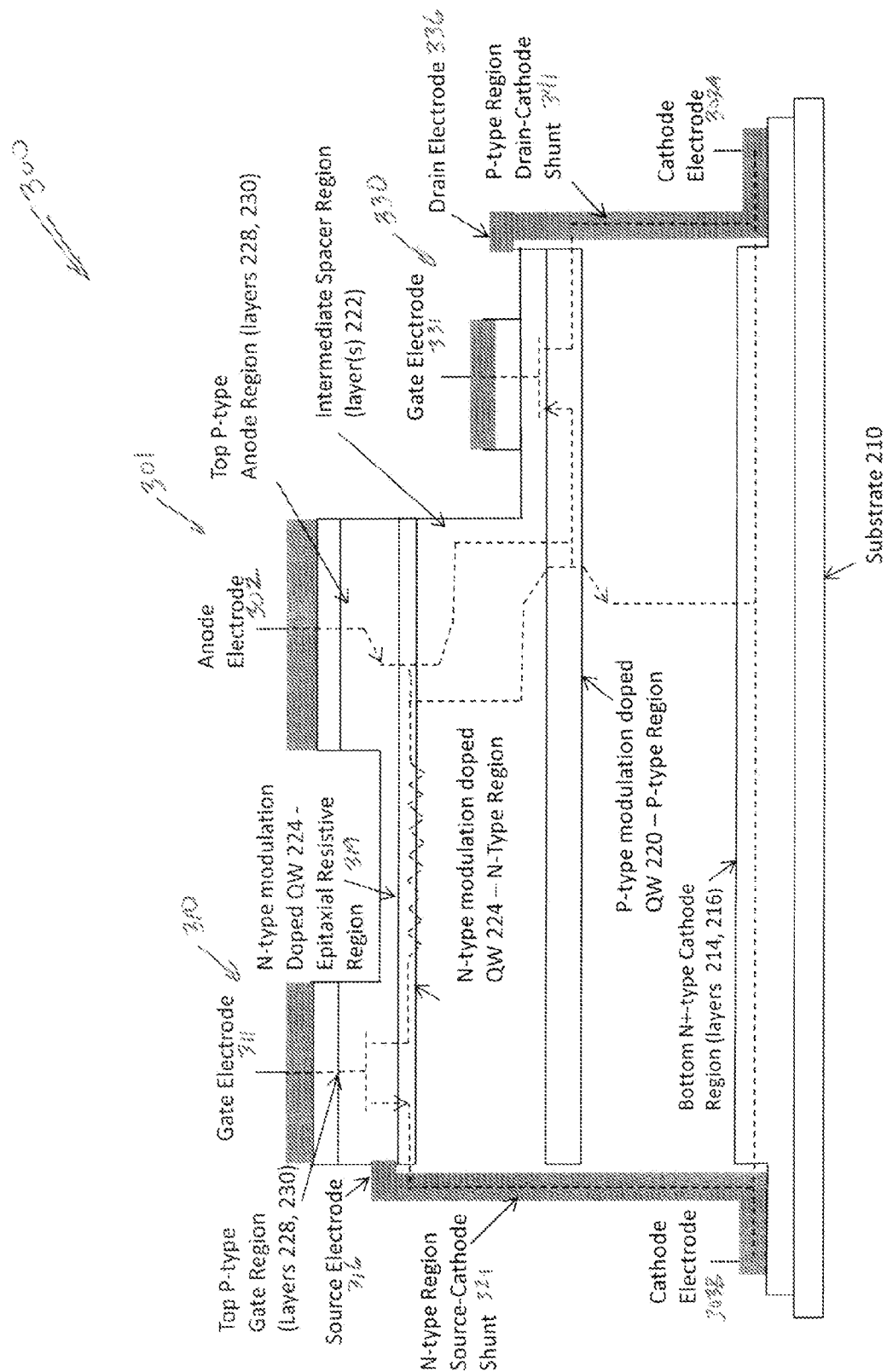
FIG. 4 is a schematic cross-section view illustrating the electrical functions for different parts of the power thyristor device of FIG. 3A.

FIG. 4 is a schematic view of the power thyristor 300 of FIG. 3 showing the major electrical functions of various parts of the power thyristor 300. In the ON state of the vertical P-N-P-N thyristor structure 301, the operating voltage between the anode terminal electrode 302 and the cathode terminal electrode (parts 303A, 303B) can extend to values in the decavolts to hectovolts to kilovoltages range suitable for many power and industrial applications. In the embodiments described herein, the thickness of the intermediate spacer region (which is defined by the spacer layer(s) 222) of the vertical P-N-P-N thyristor structure 301 can be controlled to dictate the maximum operating voltage difference between the anode terminal electrode 302 and the cathode terminal electrode (parts 303A, 303B) for normal switching operation of the current path between the anode terminal electrode 302 and the cathode terminal electrode of the vertical P-N-P-N thyristor structure 301. This maximum operating anode-cathode voltage difference in sometimes referred to as the forward breakdown voltage of the thyristor and corresponds to the anode-cathode voltage difference where no off state bias point exists. Note that beyond this maximum operating anode-cathode voltage difference, the vertical P-N-P-N thyristor structure 301 will not perform its normal switching operations as controlled by the n-channel HFET device 310 and the p-channel HFET device 330, but instead will operate in its ON state where current flows between the anode terminal electrode 302 and the cathode terminal electrode of the vertical P-N-P-N thyristor structure 301. It is expected that a thickness of the intermediate spacer region on the order of 2 µm can provide a maximum operating anode-cathode voltage difference for normal switching operation on the order of 60V for GaAs (or AlGaAs) materials in the intermediate spacer region or 600V for GaN (or AlGaN) materials in the intermediate spacer region. This maximum operating anode-cathode voltage difference is determined by the breakdown field of about $3\times10^5$V/cm for GaAs (and AlGaAs) materials and $3\times10^6$V/cm for GaN (and AlGaN) materials. The peak forward current between the anode terminal electrode 302 and the cathode terminal electrode of the vertical P-N-P-N thyristor structure 301 is determined by the thermal limit (ability to dissipate internal power). It is well known that gallium nitride (GaN) materials are almost ten times better than gallium arsenide (GaAs) materials in this regard and the optimum among all semiconductor materials. The exact current value obtained will depend on the thermal resistance which is material dependent through the thermal conductivity and will depend on the geometry. However the circular geometry of the vertical P-N-P-N thyristor structures as described below provides improved heat removal and therefore can advantageous for a high voltage, high current (i.e., high power) device.

It is also expected that a differential voltage potentials on the order of positive 1-2 volts will be applied to the gate terminal electrode 311 relative to the source terminal electrode 316 of the n-channel HFET device 310 in order to create the inversion layer of electron gas in the QW channel of the n-type modulation doped quantum well structure 224 of the n-channel HFET device 310. This inversion layer of electron gas allows electron flow from the source terminal electrode 316 to the drain implant region 315B of the n-channel HFET device 310 in order to supply electrons to the upper n-type region of the vertical P-N-P-N thyristor structure 301 that switches the current path through the vertical P-N-P-N thyristor structure into its conducting ON state. Similarly, it is expected that that differential voltage potentials on the order of negative 1-2 volts will be applied to the gate terminal electrode 331 relative to the source implant region 335B of the p-channel HFET device 330 in order to create the inversion layer of hole gas in the QW channel of the p-type modulation doped quantum well structure 220 of the p-channel HFET device 330. This inversion layer of hole gas provides a resistive shunt around the bottom thyristor junction that provides a low resistance path for hole current to flow from the lower p-type region of the vertical P-N-P-N thyristor structure 301 via the drain terminal electrode 336 of the p-channel HFET device 330 to the cathode terminal electrode and assist in rapid switching of the current path through the vertical P-N-P-N thyristor structure from its conducting ON state to its non-conducting OFF state. It is also expected that positive voltages in the decavolt to hectavolt to kilovolt range will be applied to the anode terminal electrode 302 of the vertical P-N-P-N thyristor structure 301. It is also expected that voltages at or near ground potential will be applied to the cathode terminal electrode 303 of the vertical P-N-P-N thyristor structure 301 and thus to the source terminal electrode 316 of the NHFET device 306 and to the drain terminal electrode 336 of the p-channel HFET device 330. In this configuration, there will be a very large voltage difference between the anode terminal electrode 302 of the vertical P-N-P-N thyristor structure 301 and the gate terminal electrode 311 of the n-channel HFET device 310. There will also be a very large voltage difference between the anode terminal electrode 302 of the vertical P-N-P-N thyristor structure 301 and the source terminal electrode 316 of the n-channel HFET device 310. The epitaxial resistive region 319 can be configured to provide protection against gate-drain breakdown of the re-channel HFET device 310 when switching the current path of the vertical P-N-P-N thyristor structure 301 into its ON state. The epitaxial resistive region 319 can also be configured to provide protection against drain-source breakdown of the n-channel HFET device 310 when switching the current path of the vertical P-N-P-N thyristor structure 301 into its ON state.

Figure 5:
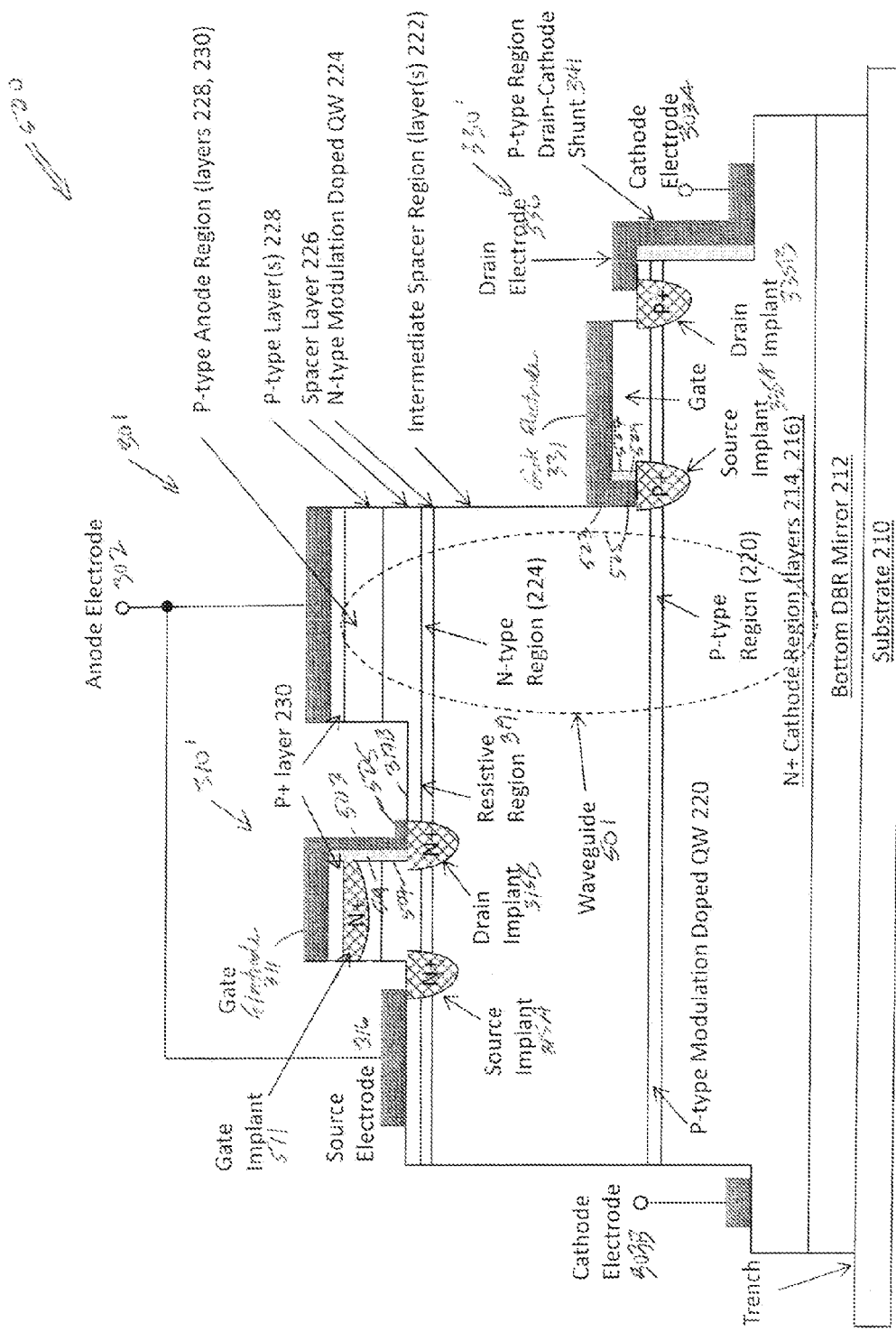
FIG. 5 is a schematic cross-section view of an embodiment of an optically-controlled power thyristor device formed from the epitaxial layer structure of FIG. 2.

FIG. 5 is a cross-sectional schematic view of a second embodiment of a power thyristor device 500 realized as part of an integrated circuit that employs the layer structure of FIG. 2. The power thyristor device 500 includes a vertical P-N-P-N thyristor structure 301 similar to the embodiment of FIGS. 3A and 3B. However, in this case, the vertical P-N-P-N structure 301 is configured as a part of a waveguide 501 that guides in-plane propagation of an optical signal through the vertical P-N-P-N structure 301 (i.e., where the light propagates in a direction orthogonal to the page of FIG. 5). Moreover, the switching action of the current path through the vertical P-N-P-N thyristor structure 301 is not controlled by electrical signals supplied to the gate electrode 311 of the re-channel HFET device (for turn ON) and to gate electrode 331 of the p-channel HFET device (for turn OFF) as described above. Instead, the switching action of the current path through the vertical P-N-P-N thyristor structure 301 is controlled by the presence (for turn ON) or absence (for turn OFF) of the optical signal within the vertical P-N-P-N thyristor structure 301 as it propagates within the waveguide 501.

Specifically, with the current path through the vertical P-N-P-N thyristor structure 301 in its OFF state, the optical signal is supplied such that is propagates through waveguide 501. Because the vertical P-N-P-N thyristor structure 301 is part the waveguide 501, the optical signal will be present within the vertical P-N-P-N thyristor structure 301. The presence of the optical signal within the vertical P-N-P-N thyristor structure 301 leads to photon absorption that results in the accumulation of majority carrier electrons in the QW channel of the n-type modulation QW structure 224 of the vertical P-N-P-N thyristor structure 301 as well as the accumulation of majority carrier holes in the QW channel of the p-type modulation doped QW structure 220 of the vertical P-N-P-N thyristor structure 301. Such accumulation of electrons in the n-type modulation doped QW structure 224 and/or the accumulation of holes in the p-type modulation doped QW structure 220 of the vertical P-N-P-N thyristor structure 301 results in accumulated charge that is greater than the critical switching charge QCR, which is that charge that reduces the forward breakdown voltage of the vertical P-N-P-N thyristor structure 301 such that no off state bias point exists. In this manner, the presence of the optical signal within the vertical P-N-P-N thyristor structure 301 causes the current path through the vertical P-N-P-N thyristor structure 301 to turn from the OFF state to the ON state.

In the second embodiment of FIG. 5, the n-channel HFET 310' is configured to remove majority carrier electrons from the upper n-type region of the vertical P-N-P-N thyristor structure 301 when the optical signal is not present within the vertical P-N-P-N thyristor structure 301. The p-channel HFET 330' is configured to remove majority carrier holes from the lower p-type region of the vertical P-N-P-N thyristor structure 301 when the optical signal is not present within the vertical P-N-P-N thyristor structure 301. These operations can be used to reduce the charge in the n-type modulation doped QW structure 224 and the charge in the p-type modulation doped QW structure 220 of the vertical P-N-P-N thyristor structure 301 below the holding charge $Q_H$, which is the critical value of the channel charge which will sustain holding action and thus cause the current path of the vertical P-N-P-N thyristor structure 301 between the anode terminal electrode 302 and the cathode terminal electrode (parts 303A, 303B) to switch from the ON state to the OFF state. Specifically, the n-channel HFET device 310' is operated as an electron current sink to remove electrons from the upper n-type region of the vertical P-N-P-N thyristor structure 301 when the optical signal is not present within the vertical P-N-P-N thyristor structure 301, and the p-channel HFET device 320' is operated as a hole current sink to remove holes from the lower p-type region of the vertical P-N-P-N thyristor structure 301 when the optical signal is not present within the vertical P-N-P-N thyristor structure 301.

In the second embodiment shown in FIG. 5, the gate terminal electrode 311 of the n-channel HFET device 310' is electrically connected by a conductive shunt 503 to a drain terminal electrode 505 formed on mesa 317B in electrical contact with the drain N+ ion implant region 315B of the n-channel HFET device 310'. The shunt 503 can extend along a sidewall 507 leading from the mesa 317B of the drain terminal electrode 505 to the mesa 313 of the gate electrode 311. An electrically-insulating material 509 (such as an oxide) can be formed on the sidewall 507 between the shunt 503 and the sidewall 507 in order to prevent current leakage into the epitaxial layers disposed below the gate electrode 311 of the n-channel HFET device 310'. The gate region below the gate electrode 311 includes an implant region 511 of N+ ion species as shown. The N+ implant region 511 can be configured to shift the threshold voltage of the n-channel HFET device 310' to be negative, meaning that the n-type electron QW channel of the re-channel HFET device 310 is ON with zero gate voltage. The source electrode 316 is electrically connected to the anode electrode 302 of the vertical P-N-P-N thyristor structure 301 as shown. In this configuration, since its gate is connected to its drain, the n-channel HFET device 310' behaves like a nonlinear resistor so that when a voltage is applied across its source and drain electrodes, the n-channel HFET device 310' conducts and without a voltage applied across its source and drain electrodes, the n-channel HFET device 310' does not conduct. This configuration can act as an electron sink that removes electrons from the upper n-type region of the vertical P-N-P-N thyristor structure 301 when the optical signal is not present within the vertical P-N-P-N thyristor structure 301. Specifically, when the optical signal terminates (and thus switches from being present to not present), there is a voltage difference across the source and drain electrodes of the re-channel HFET device 310' and the n-channel HFET device 310' operates in its conducting state to remove electrons from the upper n-type region of the vertical P-N-P-N thyristor structure 301, which draws the electron charge below the holding charge and assists in switching the anode-cathode current path through the vertical P-N-P-N thyristor structure 301 from its conducting ON state to its non-conducting OFF state. Similarly, the gate terminal electrode 331 of the p-channel HFET device 330' is electrically connected by a conductive shunt 523 to a source terminal electrode 525 formed on mesa 337A in electrical contact with the source P+ ion implant region 335A of the p-channel HFET device 330'. The shunt 523 can extend along a sidewall 527 leading from the mesa 337A of the source terminal electrode 525 to the mesa 323 of the gate electrode 331. An electrically-insulating material 529 (such as an oxide) can be formed on the sidewall 527 between the shunt 523 and the sidewall 527 in order to prevent current leakage into the epitaxial layers disposed below the gate electrode 331 of the p-channel HFET device 330'. Similar to the embodiment of FIG. 3, the drain electrode 326 is electrically connected to the cathode terminal electrode part 303A of the vertical P-N-P-N thyristor structure 301 by shunt 341 as shown. In this configuration, since the its gate is connected to its source, the p-channel HFET device 330' behaves like a nonlinear resistor so that when a voltage is applied across its source and drain electrodes, the p-channel HFET device 330' conducts and without a voltage applied across its source and drain electrodes, the p-channel HFET device 330' does not conduct. This configuration can act as a hole sink that removes holes from the lower p-type region of the vertical P-N-P-N thyristor structure 301 when the optical signal is not present within the vertical P-N-P-N thyristor structure 301. Specifically, when the optical signal terminates (and thus switches from being present to not present), there is a voltage difference across the source and drain electrodes of the p-channel HFET device 330' and the p-channel HFET device 330' operates in its conducting state to remove holes from the lower p-type region of the vertical P-N-P-N thyristor structure 301, which draws the hole charge below the holding charge and assists in switching the anode-cathode current path through the vertical P-N-P-N thyristor structure 301 from its conducting ON state to its non-conducting OFF state.

For the power thyristor 500 of FIG. 5, the waveguide 501 is formed by a cavity bounded by the bottom DBR mirror and a top mirror (which is formed over the active device structure described above). The top mirror can be formed by depositing pairs of semiconductor or dielectric materials with different refractive indices. The waveguide 501 can extend as ribs formed in the epitaxial layer structure of FIG. 2 on both sides of the vertical P-N-P-N thyristor structure 301 of the power thyristor 500. The top mirror can be formed on the top epitaxial layer of the rib waveguides. In this manner, the waveguide 501 supports in-plane propagation of the optical signal that flows through the vertical P-N-P-N thyristor structure 301 of the power thyristor 500.

Figure 6:
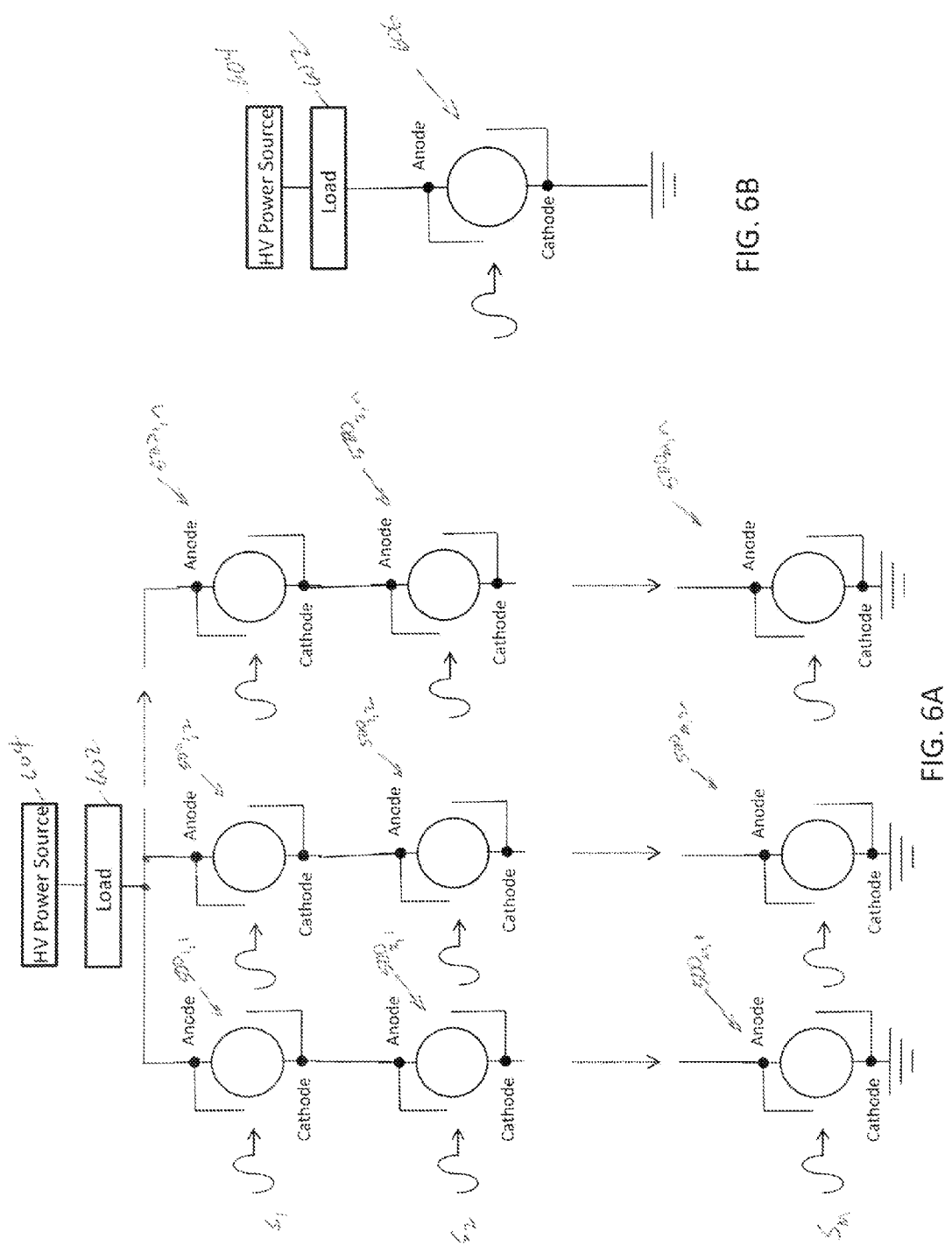
FIG. 6A is a schematic view of an array of optically-activated power thyristors of FIG. 5 for use in a power application that selectively switches high voltage power to a load.
FIG. 6B is a schematic view illustrating the effective operation of the array of optically-activated power thyristors of FIG. 5 in the application of FIG. 6A.
Figure 7:
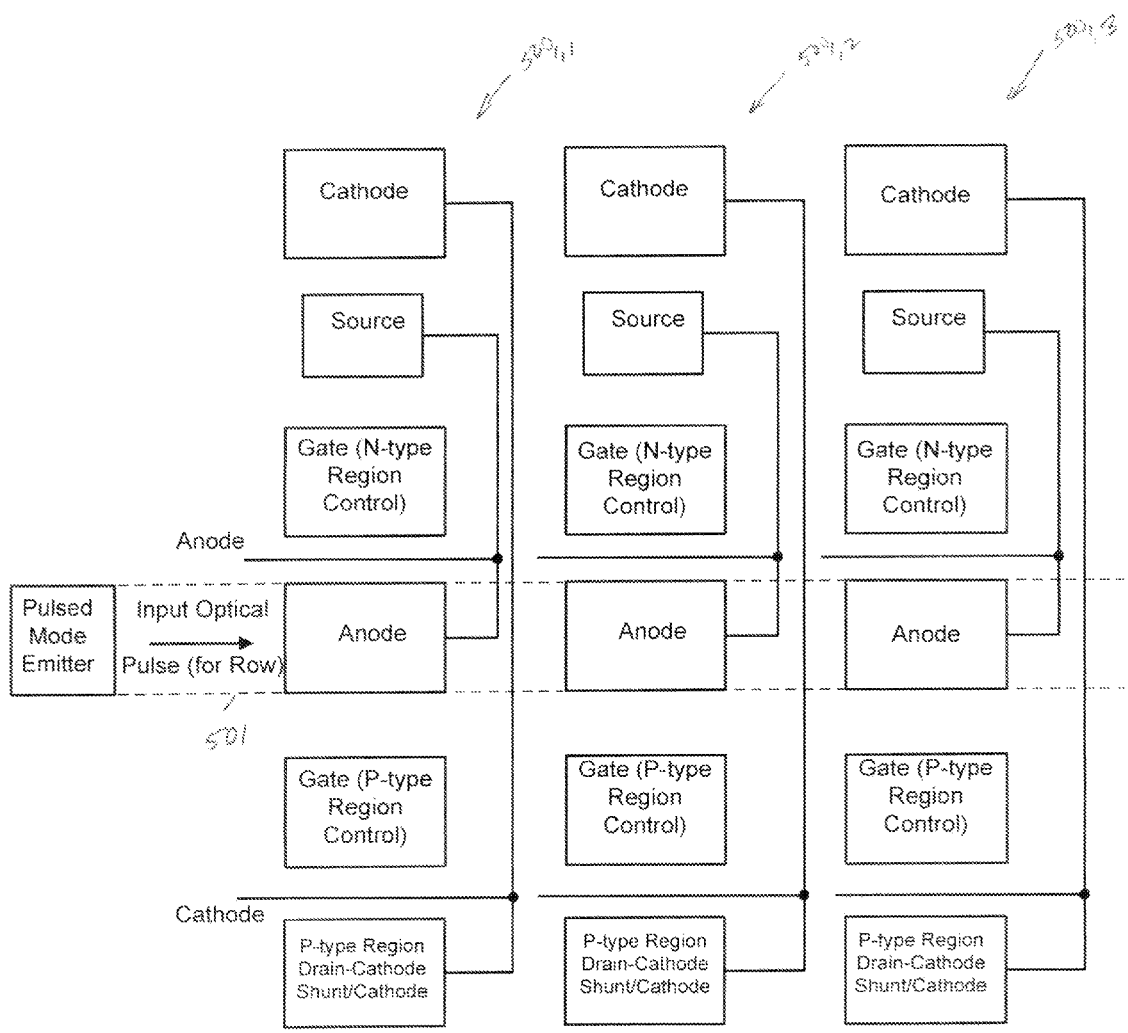
FIG. 7 is a schematic partial top view of the array of optically-activated power thyristors of FIG. 6A.

FIG. 6A is a schematic illustration of an array of power thyristor devices 500 as described above with respect to FIG. 5 whose operations are controlled by optical signals that are supplied to respective rows of the power thyristor devices 500. More specifically, the array of power thyristors 500 is arranged as an array of m rows (1 . . . m) and n columns (1 . . . n) with subscripts that correspond to the row and column of the array. As shown in FIG. 7, each row is supplied with a corresponding optical signal (S=$S_1$ . . . $S_m$) that propagates along a corresponding waveguide 510 for the row, which guides the optical signal S for in-plane propagation through the vertical P-N-P-N structures for the power thyristors of the respective row. The presence of the optical signal S within each respective vertical P-N-P-N thyristor structure of the row causes the current path through the respective vertical P-N-P-N thyristor structure to turn from the OFF state to the ON state, and the absence of the optical signal S within the respective vertical P-N-P-N thyristor structure causes the current path through each respective vertical P-N-P-N thyristor structure to turn from the ON state to the OFF state. In this manner, the optical signals for the rows can be controlled in a pulsed mode (presence/absence) in order to switch the current path through the respective vertical P-N-P-N thyristor structures of the rows between the OFF state and ON state. The optical signal can be generated by an optical emitter 701, such as an in-plane laser, corresponding to each row. The optical emitter 701 is controlled (typically by electrical drive signals) to emit the optical signal for in-plane propagation within the waveguide 501 of the corresponding row. One or more optical emitters 701 (and possibly the drive circuitry for the optical emitter(s) and other circuitry) can be integrally formed with corresponding waveguides 501 and the array of power thyristors 500 on the substrate 201 as part of a monolithic optoelectronic integrated circuit. Examples of suitable in-plane optical emitters that can be integrally formed with the array of power thyristors 500 and waveguides 501 are described in detail in International Patent Application No. PCT/US12/51265, filed on Aug. 17, 2012; U.S. patent application Ser. No. 13/921,311, filed on Jun. 19, 2013; and U.S. patent application Ser. No. 14/222,841, filed on Mar. 24, 2014; all of which are incorporated by reference above in their entireties.

Referring back to FIG. 6A, the m by n array of power thyristors 500 is electrically coupled in series between ground potential and the low voltage side of a load 602 as shown. A high voltage source 604 (which can be in the tens of kilovolts or possibly in the hundreds of kilovolts) is electrically coupled to the high voltage side of the load 602.

In one embodiment, the optical signals $S_1$ . . . $S_m$ can be supplied to the waveguides 501 of the rows of the array in a time-synchronized manner in order to synchronize the switching of the current path through the vertical P-N-P-N thyristor structures of the rows over the m rows of the array as desired. It is contemplated that the switching of the current path through the vertical P-N-P-N thyristor structures over all of the m rows can be controlled to occur simultaneously or near simultaneously. In this configuration, the high voltage of the m by n array of power thyristors operates to switch ON and OFF the supply of power to the load 602 with a desired duty cycle that is dictated by the pulsed-mode optical signals $S_1$ . . . $S_m$ supplied to the waveguides of the rows of the array. The m rows of power thyristors distributes the high voltage potential supplied by the HV source 604. For example, 5 rows of power thyristors can be used to distribute a 10 kilovolt potential supplied by the HV source 604 such that the powers thyristors in each row experience a 2.5 kilovolt operating voltage between the anode and cathode terminals of the vertical P-N-P-N thyristor structures in each row. Similarly, the n columns of power thyristors distributes the current flowing from the HV source 604 through the load 602 and through the array of power thyristors (when ON) over the series-coupled power thyristors of each column. In this configuration, the m by n array of power thyristors 500 operate in unison as one effective power thyristor 606 as shown schematically in FIG. 6B, while operating to handle the high voltage potential and currents that are supplied by the power source 604 to the load 602.

It is also contemplated that the array of power thyristors 500 can be arranged in other circuit configurations commonly used in power applications, such as H-bridge circuits, three phase controlled rectifiers, three phase thyristor power controllers, phase fired controllers, and others.

Figure 8A:
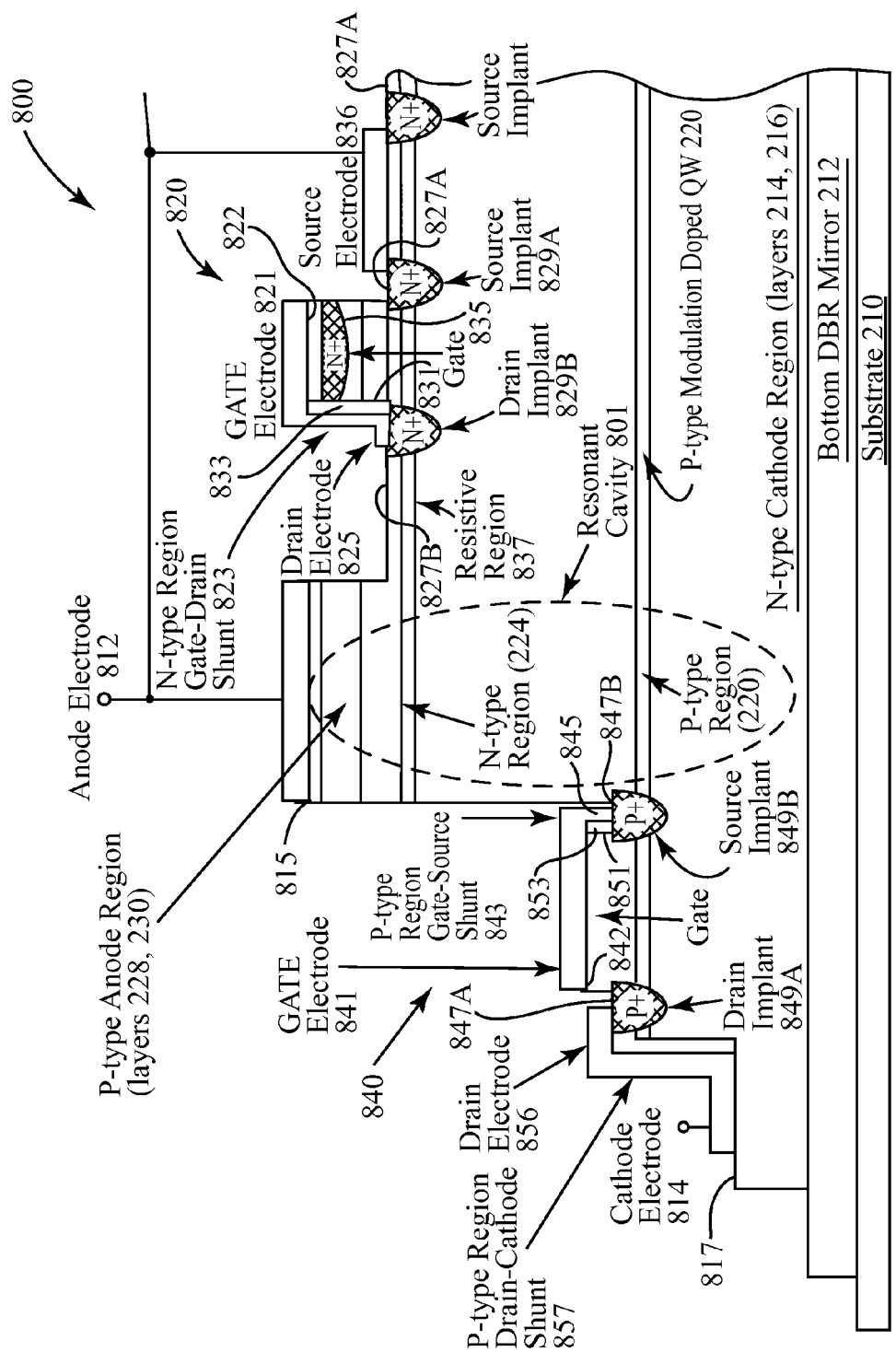
FIGS. 8A and 8B, collectively, is a schematic cross-section view of another embodiment of an electrically-controlled power thyristor device formed from the epitaxial layer structure of FIG. 2.
Figure 8B:
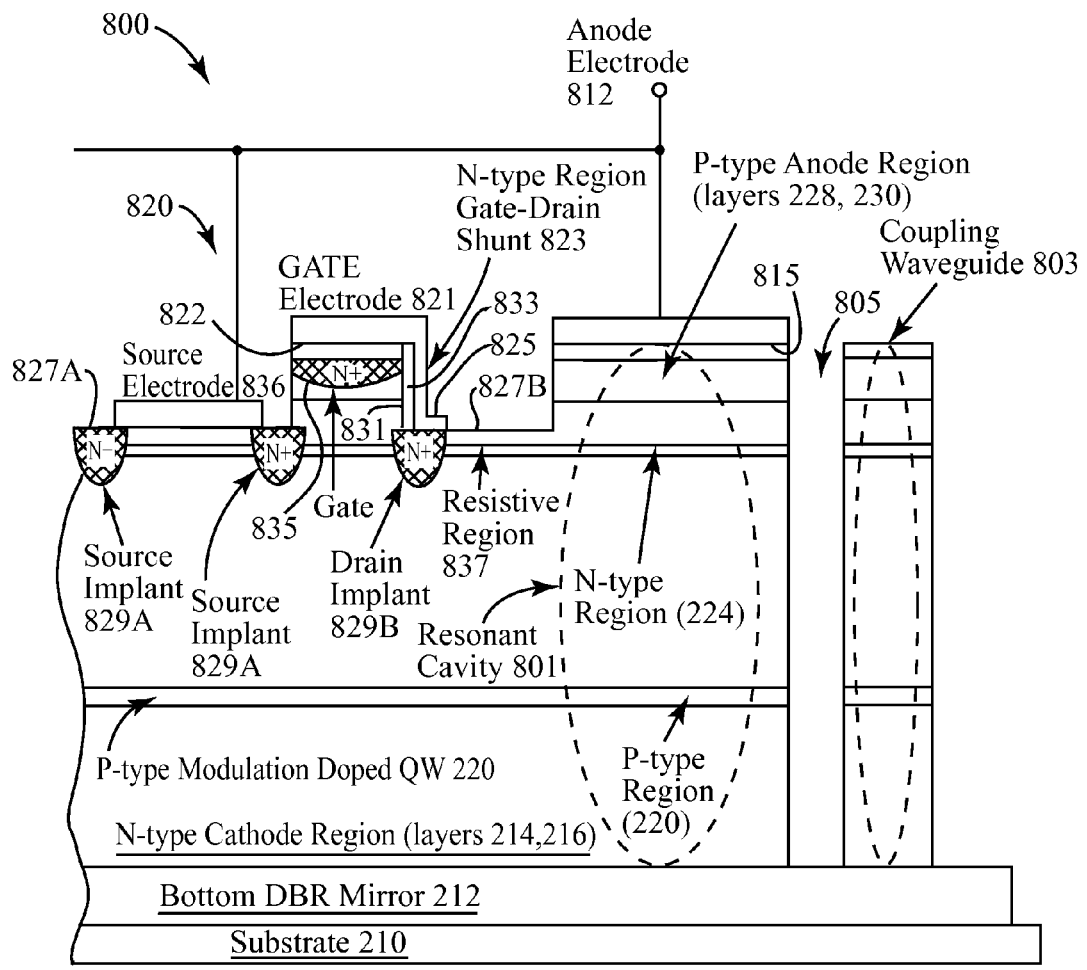
Figure 9:
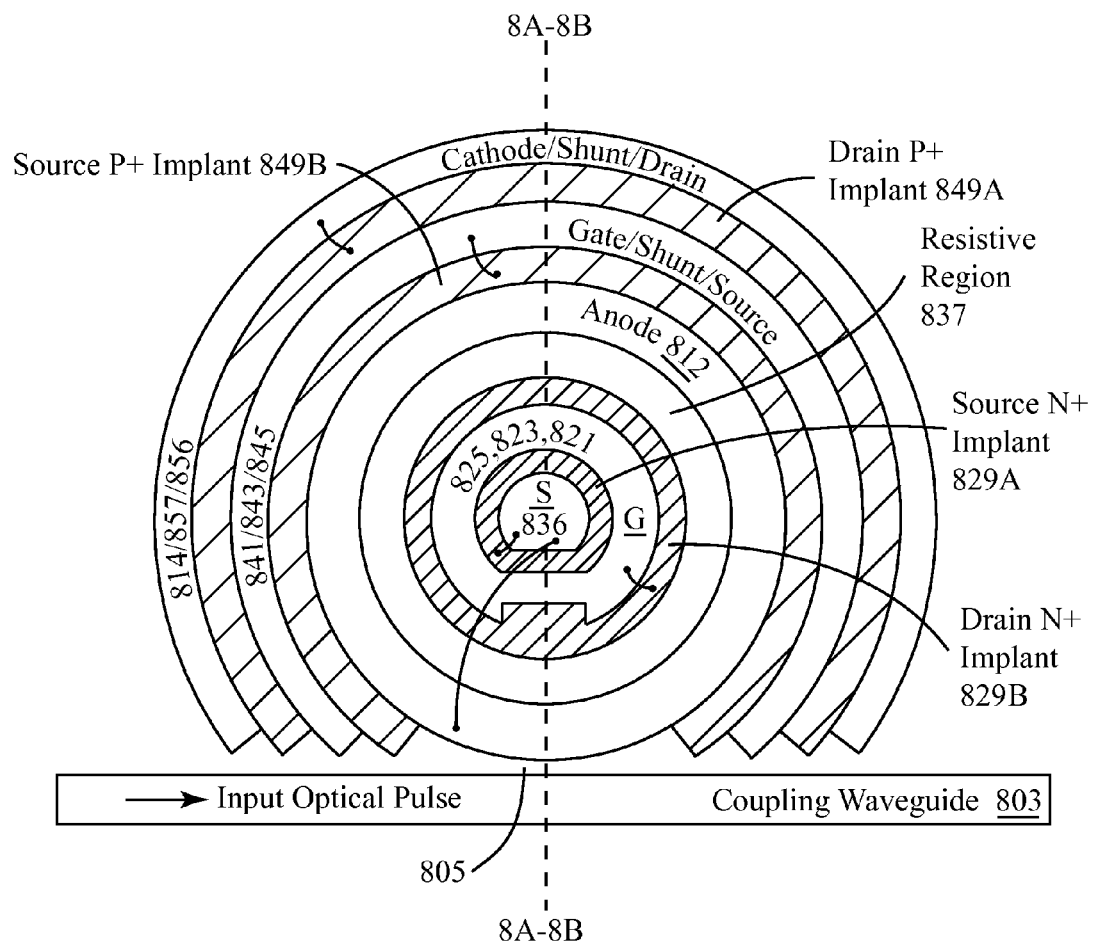
FIG. 9 is a schematic top view of the power thyristor device of FIGS. 8A and 8B.

FIGS. 8A and 8B, collectively, is a cross-sectional schematic view of a third embodiment of a power thyristor device 800 realized as part of an integrated circuit that employs the layer structure of FIG. 2. Note that parts of the power thyristor device 800 are duplicated in FIGS. 8A and 8B to clearly show the overlap between FIGS. 8A and 8B. FIG. 9 is a top view of the power thyristor device 800 of FIGS. 8A and 8B. The power thyristor device 800 includes a vertical P-N-P-N thyristor structure similar to the embodiments of FIGS. 3A and 3B and FIG. 5. However, in this case, the vertical P-N-P-N structure is annular in shape and configured as a part of an annular resonant cavity 801 that is spaced from a coupling waveguide 803 by a gap region 805 disposed therebetween (FIG. 8B). The coupling waveguide 803 guides in-plane propagation of an optical signal along the length of the coupling waveguide 803 (i.e., where the light propagates in a direction orthogonal to the page of FIG. 8B). The coupling waveguide 803 is configured to couple the optical signal into the annular resonant cavity 801 by evanescent wave coupling (also referred to as "evanescent coupling") across the gap region 805. The annular resonant cavity 801 supports circulating propagation of the optical signal within the annular resonant cavity 801. The optical path length of the annular resonant cavity 801 is tuned to the particular wavelength of the optical signal that is guided by coupling waveguide 803 and coupled into the annular resonant cavity 801.

The power thyristor device 800 includes a top anode terminal electrode 812 and a bottom cathode terminal electrode 814 as shown. The top anode terminal electrode 812 is formed on a mesa 815 of annular shape (or outline) as best shown in FIG. 9 and defined by the top surface of the p+-type ohmic contact layer 230. The anode terminal electrode 812 is formed in electrical contact with a p-type anode region (i.e., the first P) of the vertical P-N-P-N thyristor structure of the annular resonant cavity 801. The p-type anode region is defined by the p-type layers 230 and 228 that underlie the anode terminal electrode 812 as part of the annular mesa 815. The metal of the anode terminal electrode 812 can be tungsten or other suitable metal or alloy that is patterned by lift off or another suitable metallization process. The p-type anode region of layers 230 and 228 is spaced vertically above an upper n-type region (i.e., the first N) of the vertical P-N-P-N thyristor structure of the annular resonant cavity 801, which is defined by the n-type modulation doped QW structure 224. A spacer layer 226 is disposed between the p-type anode region and the upper n-type region defined by the n-type modulation doped QW structure 224. The upper n-type region is spaced vertically above a lower p-type region (i.e., the second P) of the vertical P-N-P-N thyristor structure of the annular resonant cavity 801, which is defined by the p-type modulation doped QW structure 220. An intermediate spacer region (which is defined by the spacer layer(s) 222) is disposed between the upper n-type region and the lower p-type region. The lower p-type region is spaced vertically above a bottom n-type cathode region (i.e., the second N) of the vertical P-N-P-N thyristor structure of the annular resonant cavity 801, which is defined by the n-type layers 216 and 214. One or more spacer layers 218 are disposed between the lower p-type region and the bottom n-type cathode region. The cathode terminal electrode 814 is formed on an annular mesa 817 that is patterned as truncated annulus with ends near the waveguide 803 as best shown in FIG. 9. The mesa 817 is defined at the n-type ohmic contact layer 214 for electrical contact to the bottom n-type cathode region of the vertical P-N-P-N thyristor structure of the annular resonant cavity 801.

In the configuration of FIGS. 8A, 8B and 9, the switching action of the current path through the vertical P-N-P-N thyristor structure of the annular resonant cavity 801 is controlled by the presence (for turn ON) or absence (for turn OFF) of the optical signal within the vertical P-N-P-N thyristor structure of the annular resonant cavity 801. The power thyristor device 800 includes an n-channel HFET device 820 that is integrally formed in the layer structure of FIG. 2 within the central region of the vertical P-N-P-N thyristor structure of the annular resonant cavity 801 (specifically, it is offset laterally inside the vertical P-N-P-N thyristor structure of the annular resonant cavity 801). The power thyristor device 800 also includes a p-channel HFET device 840 that is integrally formed defined in the layer structure of FIG. 2 outside the central region of the vertical P-N-P-N thyristor structure of the annular resonant cavity 801 (specifically it is offset laterally outside the vertical P-N-P-N thyristor structure of the annular resonant cavity 801). The n-channel HFET device 820 is configured to remove majority carrier electrons from the upper n-type region of the vertical P-N-P-N thyristor structure of the annular resonant cavity 801 when the optical signal is not present within the vertical P-N-P-N thyristor structure of the annular resonant cavity 801. The p-channel HFET device 840 is configured to remove majority carrier holes from the lower p-type region of the vertical P-N-P-N thyristor structure of the annular resonant cavity 801 when the optical signal is not present within the vertical P-N-P-N thyristor structure of the annular resonant cavity 801. These operations can be used to reduce the charge in the n-type modulation doped QW structure 224 and the charge in the p-type modulation doped QW structure 220 of the vertical P-N-P-N thyristor structure of the annular resonant cavity 801 below the holding charge $Q_H$, which is the critical value of the channel charge which will sustain holding action and thus cause the current path of the vertical P-N-P-N thyristor structure of the annular resonant cavity 801 between the anode terminal electrode 812 and the cathode terminal electrode 814 to switch from the ON state to the OFF state. Specifically, the n-channel HFET device 820 is operated as an electron current sink to remove electrons from the upper n-type region of the vertical P-N-P-N thyristor structure of the annular resonant cavity 801 when the optical signal is not present within the vertical P-N-P-N thyristor structure of the annular resonant cavity 801, and the p-channel HFET device 840 is operated as a hole current sink to remove holes from the lower p-type region of the vertical P-N-P-N thyristor structure of the annular resonant cavity 801 when the optical signal is not present within the vertical P-N-P-N thyristor structure of the annular resonant cavity 801.

In the embodiment shown, the n-channel HFET device 820 includes a gate terminal electrode 821 electrically connected by a conductive shunt 823 to a drain terminal electrode 825. The gate terminal electrode 822 is formed on a mesa 822 of annular shape and defined by the top surface of the p+-type ohmic contact layer 230. The gate terminal electrode 825 is formed in electrical contact with a p-type gate region disposed therebelow. The mesa 822 of the gate terminal electrode 821 is offset laterally inside the mesa 815 of the anode terminal electrode 812 of the vertical P-N-P-N thyristor structure of the annular resonant cavity 801 as shown. The metal of the gate terminal electrode 821 can be the same metal as the anode terminal electrode 812 (such as tungsten or other suitable metal or alloy) and patterned together by lift off or another suitable metallization process. The mesa 822 and metal of the gate terminal electrode 821 can be patterned with a cut-out section on the side facing the coupling waveguide 803 as shown. The cut-out section functions to provide the necessary gap region between the thyristor waveguide and the straight waveguide and enables the evanescent coupling of light into the device. The drain terminal electrode 825 is formed on annular intermediate mesa 827B in electrical contact with an annular drain N+ ion implant region 829B. The intermediate mesa 827B is formed at the spacer layer(s) 226 of the layer structure of FIG. 2 and is disposed outside the mesa 822 between the mesa 822 of the gate terminal electrode 821 and the mesa 815 of the anode terminal electrode 812. The shunt 823 can extend along an annular sidewall 831 leading from the mesa 827B of the drain terminal electrode 505 to the mesa 822 of the gate electrode 821. An electrically-insulating material 833 (such as an oxide) can be formed on the annular sidewall 831 between the shunt 823 and the sidewall 831 in order to prevent current leakage into the epitaxial layers disposed below the gate electrode 821. The gate region below the gate electrode 821 includes an implant region 835 of N+ ion species as shown. The n-channel HFET device 820 also includes a source terminal electrode 836 formed on an annular intermediate mesa 827A. The intermediate mesa 827A is formed at the spacer layer(s) 226 of the layer structure of FIG. 2 and is disposed inside the annular mesa 822 of the gate terminal electrode 821 (opposite the intermediate mesa 827B of the drain terminal electrode 825). The source terminal electrode 836 is formed in electrical contact with a source N+ ion implant region 829A, which has an annular shape evident from FIGS. 8A, 8B and 9. The source and drain ion implant regions 829A, 829B both extend to a depth that encompass the n-type modulation doped QW structure 224. A current path between the source terminal electrode 836/source implant region 829A and the drain terminal electrode 825/drain implant region 829B of the n-channel HFET device 310 is defined by the n-type modulation doped QW structure 224 that underlies the gate electrode 821 of the n-channel HFET device 820. This current path extends beyond the drain electrode 825 and the drain implant region 829B through an epitaxial resistive region 837 (which is also defined by the n-type modulation doped QW structure 224) to the upper n-type region (which is defined by the n-type modulation doped QW structure 224) of the vertical P-N-P-N thyristor structure of the annular resonant cavity 801. In this manner, the epitaxial resistive region 837 is electrically connected in series between the source-drain current path of the n-channel HFET device 820 and the upper n-type region of the vertical P-N-P-N thyristor structure of the annular resonant cavity 801. The length dimension of the epitaxial resistive region 837 (which is governed by the radial offset or spacing between the drain implant region 829B of the n-channel HFET device 820 and the upper n-type region of the vertical P-N-P-N thyristor structure of the annular resonant cavity 801) controls the resistance provided by the epitaxial resistive region 837. Such dimensions are not necessarily show to scale in FIGS. 8A, 8B and 9.

In the embodiment shown, the p-channel HFET device 840 includes a gate terminal electrode 841 electrically connected by a conductive shunt 843 to a source terminal electrode 845. The gate terminal electrode 841 is formed on a mesa 842 of annular shape and defined by the top surface of the spacer layer(s) 222. The gate terminal electrode 841 is formed in electrical contact with a gate region disposed therebelow. The mesa 842 of the gate terminal electrode 841 is offset laterally outside the mesa 815 of the anode terminal electrode 812 of the vertical P-N-P-N thyristor structure of the annular resonant cavity 801 as shown. The metal of the gate terminal electrode 841 and shunt 843 can be the same metal as the cathode terminal electrode 814 and patterned together by lift off or another suitable metallization process. The mesa 842 and metal of the gate terminal electrode 841 can be patterned as a truncated annulus with ends facing the coupling waveguide 803 as best shown in FIG. 9. The source terminal electrode 845 is formed on annular intermediate mesa 847B in electrical contact with an annular source P+ ion implant region 849B. The intermediate mesa 847B is formed at the spacer layer(s) 222 of the layer structure of FIG. 2 below the gate mesa 842 and is disposed outside the mesa 815 between the mesa 842 of the gate terminal electrode 841 and the mesa 815 of the anode terminal electrode 812. The shunt 843 can extend along an annular sidewall 851 leading from the mesa 847B of the source terminal electrode 845 to the mesa 842 of the gate electrode 841. An electrically-insulating material 853 (such as an oxide) can be formed on the annular sidewall 851 between the shunt 843 and the sidewall 851 in order to prevent current leakage into the epitaxial layers disposed below the gate electrode 841. The p-channel HFET device 840 also includes a drain terminal electrode 856 formed on an annular intermediate mesa 847A. The intermediate mesa 847A is formed at the spacer layer(s) 222 of the layer structure of FIG. 2 (with the source mesa 847B) below mesa 842 and is disposed outside the annular mesa 842 of the gate terminal electrode 841 (opposite the intermediate mesa 847B of the source terminal electrode 845). The drain terminal electrode 856 is formed in electrical contact with a source P+ ion implant region 849A, which preferably has an annular shape evident from FIGS. 8A, 8B and 9. The source and drain ion implant regions 849A, 849B both extend to a depth that encompass the p-type modulation doped QW structure 220. A current path between the source terminal electrode 845/source implant region 849A and the drain terminal electrode 856/drain implant region 849B of the p-channel HFET device 840 is defined by the p-type modulation doped QW structure 220 that underlies the gate electrode 841 of the p-channel HFET device 840. This current path extends beyond the source electrode 845 and the source implant region 849B to the lower p-type region (which is defined by the p-type modulation doped QW structure 220) of the vertical P-N-P-N thyristor structure of the annular resonant cavity 801.

In the embodiment shown, the source electrode 836 of the n-channel HFET device 820 is electrically connected to the anode electrode 812 of the vertical P-N-P-N thyristor structure of the annular resonant cavity 801 as shown. In this configuration, since its gate is connected to its drain, the n-channel HFET device 820 behaves like a nonlinear resistor so that when a voltage is applied across its source and drain electrodes, the n-channel HFET device 820 conducts and without a voltage applied across its source and drain electrodes, the n-channel HFET device 820 does not conduct. This configuration can act as an electron sink that removes electrons from the upper n-type region of the vertical P-N-P-N thyristor structure of the annular resonant cavity 801 when the optical signal is not present within such vertical P-N-P-N thyristor structure. Similarly, the gate terminal electrode 841 of the p-channel HFET device 840 is electrically connected by the shunt 843 to the source terminal electrode 845, and the drain terminal electrode 856 is electrically connected to the cathode terminal electrode 814 of the vertical P-N-P-N thyristor structure by shunt 857 as shown. In this configuration, since its gate is connected to its source, the p-channel HFET device 840 behaves like a nonlinear resistor so that when a voltage is applied across its source and drain electrodes, the p-channel HFET device 840 conducts and without a voltage applied across its source and drain electrodes, the p-channel HFET device 840 does not conduct. This configuration can act as a hole sink that removes holes from the lower p-type region of the vertical P-N-P-N thyristor structure of the annular resonant cavity 801 when the optical signal is not present within such vertical P-N-P-N thyristor structure.

Specifically, with the current path through the vertical P-N-P-N thyristor structure of the resonant cavity 801 in its OFF state, the optical signal is supplied such that is propagates through waveguide 801 and couples into the annular resonant cavity 801 by evanescent coupling across the gap region 805, which results in circulating propagation of the optical signal within the annular resonant cavity 801. The presence of the circulating optical signal within the annular resonant cavity 801 leads to photon absorption that results in the accumulation of majority carrier electrons in the QW channel of the n-type modulation QW structure 224 of the vertical P-N-P-N thyristor structure of the annular resonant cavity 801 as well as the accumulation of majority carrier holes in the QW channel of the p-type modulation doped QW structure 220 of the vertical P-N-P-N thyristor structure of the annular resonant cavity 801. Such accumulation of electrons in the n-type modulation doped QW structure 224 and/or the accumulation of holes in the p-type modulation doped QW structure 220 of the vertical P-N-P-N thyristor structure of the annular resonant cavity 801 results in accumulated charge that is greater than the critical switching charge QCR, which is that charge that reduces the forward breakdown voltage of the vertical P-N-P-N thyristor structure of the annular resonant cavity 801 such that no off state bias point exists. In this manner, the presence of the optical signal within the vertical P-N-P-N thyristor structure of the annular resonant cavity 801 is configured to cause the current path through the vertical P-N-P-N thyristor structure of the annular resonant cavity 801 to turn from the OFF state to the ON state.

With the current path through the vertical P-N-P-N thyristor structure of the resonant cavity 801 in its ON state, the optical signal can be terminated such that is does not propagate through waveguide 801. In this configuration, the remaining optical mode propagating in the annular resonant cavity 801 will coupled out of the resonant cavity 801 and into the coupling waveguide by evanescent coupling across the gap region 805 such that the optical signal is not present within the vertical P-N-P-N thyristor structure of the annular resonant cavity 801. With the optical signal not present within the vertical P-N-P-N thyristor structure of the annular resonant cavity 801, the bias conditions of the re-channel HFET device 820 are configured to remove majority carrier electrons from the upper n-type region of the vertical P-N-P-N thyristor structure of the annular resonant cavity 801 and the bias conditions of the p-channel HFET device 840 are configured to remove majority carrier holes from the lower p-type region of the vertical P-N-P-N thyristor structure of the annular resonant cavity 801 as described above. These operations can be used to reduce the charge in the n-type modulation doped QW structure 224 and to reduce the charge in the p-type modulation doped QW structure 220 of the vertical P-N-P-N thyristor structure of the annular resonant cavity 801 below the holding charge $Q_H$, which is the critical value of the channel charge which will sustain holding action and thus cause the current path of the vertical P-N-P-N thyristor structure of the annular resonant cavity 801 between the anode terminal electrode 812 and the cathode terminal electrode 814 to switch from the ON state to the OFF state.

The optically-activated power thyristor device 800 of FIGS. 8A, 8B and 9 can be replicated to form an array of power thyristor devices 800 similar to the embodiment described above with respect to FIGS. 6A, 6B and 7. The optical control signal for each row of the array can be generated by an optical emitter as described above for in-plane propagation within the respective waveguide 803 of the corresponding row. One or more optical emitters (and possibly the drive circuitry for the optical emitter(s) and other circuitry) can be integrally formed with corresponding waveguides 803 and the array of power thyristors 800 on the substrate 201 as part of a monolithic optoelectronic integrated circuit. Examples of suitable in-plane optical emitters that can be integrally formed with the array of power thyristors 800 and waveguides 803 are described in detail in International Patent Application No. PCT/US12/51265, filed on Aug. 17, 2012; U.S. patent application Ser. No. 13/921,311, filed on Jun. 19, 2013; and U.S. patent application Ser. No. 14/222,841, filed on Mar. 24, 2014; all of which are incorporated by reference above in their entireties.

There have been described and illustrated herein several embodiments of a power thyristor semiconductor device and monolithic integrated circuits based thereon. While particular embodiments have been described, it is not intended that the invention be limited thereto, as it is intended that the claims be as broad in scope as the art will allow and that the specification be read likewise. It will therefore be appreciated by those skilled in the art that yet other modifications could be made to the disclosed embodiments without deviating from its spirit and scope as claimed.

What is claimed is:

1. A semiconductor device suitable for power applications, the semiconductor device comprising:
    a substrate;
    a thyristor epitaxial layer structure defining an anode region offset vertically from a cathode region with a plurality of intermediate regions therebetween and with a switchable current path extending vertically between the anode region and the cathode region through the plurality of intermediate regions, wherein the switchable current path has an conducting state where current flows through the current path between the anode region and the cathode region, and wherein the switchable current path has a non-conducting state where current does not flow through the current path between the anode region and the cathode region;
    an anode terminal electrode electrically coupled to the anode region;
    a cathode terminal electrode electrically coupled to the cathode region;
    an epitaxial resistive region that is electrically coupled to and extends laterally from a particular one of said plurality of intermediate regions; and
    a first field effect transistor having a channel for current flow therethrough, wherein the channel of the first field effect transistor is electrically coupled to and extends laterally from the epitaxial resistive region;
    wherein the thyristor epitaxial layer structure, the anode terminal electrode, the cathode terminal electrode and the first field effect transistor are integrally formed on the substrate;
    wherein the particular one intermediate region of the thyristor epitaxial structure is defined by a modulation doped quantum well structure, the modulation doped quantum well structure forming the channel of the first field effect transistor, and the modulation doped quantum well structure extending laterally away from the thyristor epitaxial layer structure to form the epitaxial resistive region that extends between the thyristor epitaxial layer structure and the first field effect transistor.

2. A semiconductor device according to claim 1, wherein:
    the intermediate regions of the thyristor epitaxial layer structure include at least one of an n-type modulation doped QW structure and a p-type modulation doped QW structure.

3. A semiconductor device according to claim 1, wherein:
    the intermediate regions of the thyristor epitaxial layer structure include both an n-type modulation doped QW structure and a p-type modulation doped QW structure.

4. A semiconductor device according to claim 1, wherein:
    the epitaxial resistive region provides protection against voltage breakdown between the anode terminal electrode and the first field effect transistor for anode voltages at least greater than 50 volts.

5. A semiconductor device according to claim 1, wherein:
    the first field effect transistor is configured to inject electrical carriers into the particular one intermediate region in order to switch the switchable current path from its non-conducting state into its conducting state.

6. A semiconductor device according to claim 1, wherein:
the first field effect transistor is configured to remove electrical carriers from the particular one intermediate region in order to switch the switchable current path from its conducting state into its non-conducting state.

7. A semiconductor device according to claim 1, further comprising:
a second field effect transistor integrally formed on the substrate, wherein the second field effect transistor has a channel for current flow therethrough, wherein the channel of the second field effect transistor extends laterally away from another one of said plurality of intermediate regions opposite the first field effect transistor.

8. A semiconductor device according to claim 7, wherein:
the second field effect transistor is configured to remove electrical carriers from the another one intermediate region in order to switch the switchable current path from its conducting state into its non-conducting state.

9. A semiconductor device according to claim 1, wherein:
the plurality of intermediate regions includes a spacer region configured to provide a forward breakdown voltage at least greater than 50 volts.

10. A semiconductor device according to claim 1, further comprising:
a first shunt electrode part that provides electrical coupling between the cathode terminal electrode and the first field effect transistor.

11. A semiconductor device according to claim 10, wherein:
the first field effect transistor comprises an n-type field effect transistor with source and drain terminal electrodes disposed on opposite sides of a gate terminal electrode and an n-type channel disposed under the gate terminal electrode; and
the first shunt electrode part is formed on a sidewall that extends between the cathode terminal electrode and the source terminal electrode of the first field effect transistor.

12. A semiconductor device according to claim 10, further comprising:
a second field effect transistor having a channel that is electrically coupled to another one of said plurality of intermediate regions, wherein the second field effect transistor comprises a p-type field effect transistor with source and drain terminal electrodes disposed on opposite sides of a gate terminal electrode and a p-type channel disposed under the gate terminal electrode; and
a second shunt electrode part that provides electrical coupling between the cathode terminal electrode and the second field effect transistor.

13. A semiconductor device according to claim 12, wherein:
the second shunt electrode part is formed on a sidewall that extends between the cathode terminal electrode and the drain terminal electrode of the second field effect transistor.

14. A semiconductor device according to claim 1, wherein:
the thyristor epitaxial layer structure is configured to switch the switchable current path between its conducting state and its non-conducting state based on presence and absence of an optical signal within the thyristor epitaxial layer structure.

15. A semiconductor device according to claim 14, wherein:
the thyristor epitaxial layer structure is part of a waveguide that guides in-plane propagation of said optical signal.

16. A semiconductor device according to claim 14, wherein:
the thyristor epitaxial layer structure is part of a resonant cavity offset from a waveguide by a gap region therebetween, wherein the waveguide is configured to guide in-plane propagation of said optical signal, and said resonant cavity is configured receive said optical signal by evanescent coupling between the waveguide and the resonant cavity.

17. A semiconductor device according to claim 16, wherein:
the resonant cavity has an annular shape defined by an annular mesa formed by the thyristor epitaxial layer structure.

18. A semiconductor device according to claim 16, wherein:
the waveguide is an epitaxial waveguide formed from a common epitaxial layer structure that forms the thyristor epitaxial layer structure.

19. A semiconductor device according to claim 14, wherein:
the first field effect transistor is configured to drain electrical carriers from the particular one intermediate region when the optical signal is not present in order to switch the switchable current path from its conducting state into its non-conducting state.

20. A semiconductor device according to claim 19, wherein:
the first field effect transistor comprises an n-type field effect transistor with source and drain terminal electrodes disposed on opposite sides of a gate terminal electrode and an n-type channel disposed under the gate terminal electrode; and
a first shunt electrode part that is formed on a sidewall that extends between the gate terminal electrode and the drain terminal electrode of the first field effect transistor.

21. A semiconductor device according to claim 20, wherein:
the first field effect transistor includes a gate region implanted with N+ ion species.

22. A semiconductor device according to claim 19, further comprising:
a second field effect transistor that is configured to remove electrical carriers from the another one of said plurality of intermediate regions when the optical signal is not present in order to switch the switchable current path from its conducting state into its non-conducting state.

23. A semiconductor device according to claim 21, wherein:
the second field effect transistor comprises a p-type field effect transistor with source and drain terminal electrodes disposed on opposite sides of a gate terminal electrode and a p-type channel disposed under the gate terminal electrode; and
a second shunt electrode part that is formed on a sidewall that extends between the gate terminal electrode and the source terminal electrode of the second field effect transistor.

24. A semiconductor device according to claim 23, wherein:
the intermediate regions of the thyristor epitaxial layer structure include both an n-type modulation doped QW structure and a p-type modulation doped QW structure;
the channel of the first field effect transistor includes an n-type QW channel formed by the n-type modulation doped QW structure; and the channel of the second field effect transistor includes a p-type QW channel formed by the p-type modulation doped QW structure.

25. A semiconductor device according to claim 1, wherein:
at least the thyristor epitaxial layer structure comprises group III-V materials.

26. A semiconductor device according to claim 25, wherein:
the group III-V materials are selected from the group consisting of gallium and nitrogen (for gallium nitride layer structures), gallium and arsenic (for gallium arsenide layers structures) as well as aluminum, indium, and combinations thereof.

27. An integrated circuit comprising:
a substrate; and
an array of semiconductor devices according to claim 1 that are integrally formed on said substrate.

28. An integrated circuit according to claim 27, further comprising:
control circuitry that controls switching operations of the array of semiconductor devices, wherein the control circuitry is integrally formed on the substrate.

29. An integrated circuit according to claim 28, wherein:
the control circuitry comprises at least one optical emitter and corresponding waveguide that guides in-plane propagation of an optical signal to the array of semiconductor devices.

* * * * *